US012431778B2

(12) United States Patent
Yamamoto

(10) Patent No.: US 12,431,778 B2
(45) Date of Patent: Sep. 30, 2025

(54) TRANSPORT SYSTEM, MOVER, CONTROL DEVICE, AND CONTROL METHOD

(71) Applicant: CANON KABUSHIKI KAISHA, Tokyo (JP)

(72) Inventor: Takeshi Yamamoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 208 days.

(21) Appl. No.: 17/487,616

(22) Filed: Sep. 28, 2021

(65) Prior Publication Data

US 2022/0014084 A1 Jan. 13, 2022

Related U.S. Application Data

(63) Continuation of application No. PCT/JP2020/014370, filed on Mar. 27, 2020.

(30) Foreign Application Priority Data

| Mar. 29, 2019 | (JP) | 2019-068354 |
| Mar. 25, 2020 | (JP) | 2020-054793 |

(51) Int. Cl.
*H02K 41/03* (2006.01)
*H05K 13/04* (2006.01)

(52) U.S. Cl.
CPC .......... *H02K 41/031* (2013.01); *H05K 13/04* (2013.01)

(58) Field of Classification Search
CPC .... H02K 41/031; H02K 41/033; H02K 41/03; H02K 41/02; H05K 13/04
USPC ...................................................... 310/12.24
See application file for complete search history.

(56) References Cited

U.S. PATENT DOCUMENTS

| 5,668,090 A * | 9/1997 | Kalsi ................... H01F 6/00 310/12.24 |
| 2002/0105237 A1* | 8/2002 | Itoh ................ H02K 41/033 310/12.02 |
| 2002/0130630 A1* | 9/2002 | Uchida ............... H02K 41/03 318/114 |
| 2004/0244636 A1* | 12/2004 | Meadow, Jr. ..... A63B 21/00192 104/284 |
| 2005/0285451 A1* | 12/2005 | Kubo ................ G03F 7/70758 310/12.15 |
| 2016/0355350 A1* | 12/2016 | Yamamoto .......... B65G 37/00 |
| 2019/0092578 A1* | 3/2019 | Umeyama ............ B60L 13/03 |
| 2021/0159091 A1* | 5/2021 | Zhou ................... B60L 13/10 |

FOREIGN PATENT DOCUMENTS

| JP | H10583924 A | 4/1993 |
| JP | H07107779 A | 4/1995 |
| JP | 2003052164 A * | 2/2003 |
| JP | 2005354891 A | 12/2005 |

(Continued)

OTHER PUBLICATIONS

Machine translation of JP-2003052164-A. (Year: 2003).*

*Primary Examiner* — Michael Andrews
(74) *Attorney, Agent, or Firm* — Canon U.S.A., Inc. IP Division

(57) ABSTRACT

A transport system includes: a mover including a force receiving part made of soft magnetic material; and a plurality of coils arranged along the first direction, wherein the mover is movable in the first direction along the plurality of coils by a force received by the force-receiving part from a magnetic field by the plurality of coils.

15 Claims, 15 Drawing Sheets

(56) References Cited

FOREIGN PATENT DOCUMENTS

| | | | |
|---|---|---|---|
| JP | 2009254173 | A | 10/2009 |
| JP | 2015230927 | A | 12/2015 |
| JP | 2016532308 | A | 10/2016 |
| KR | 20140056699 | A | 5/2014 |

* cited by examiner

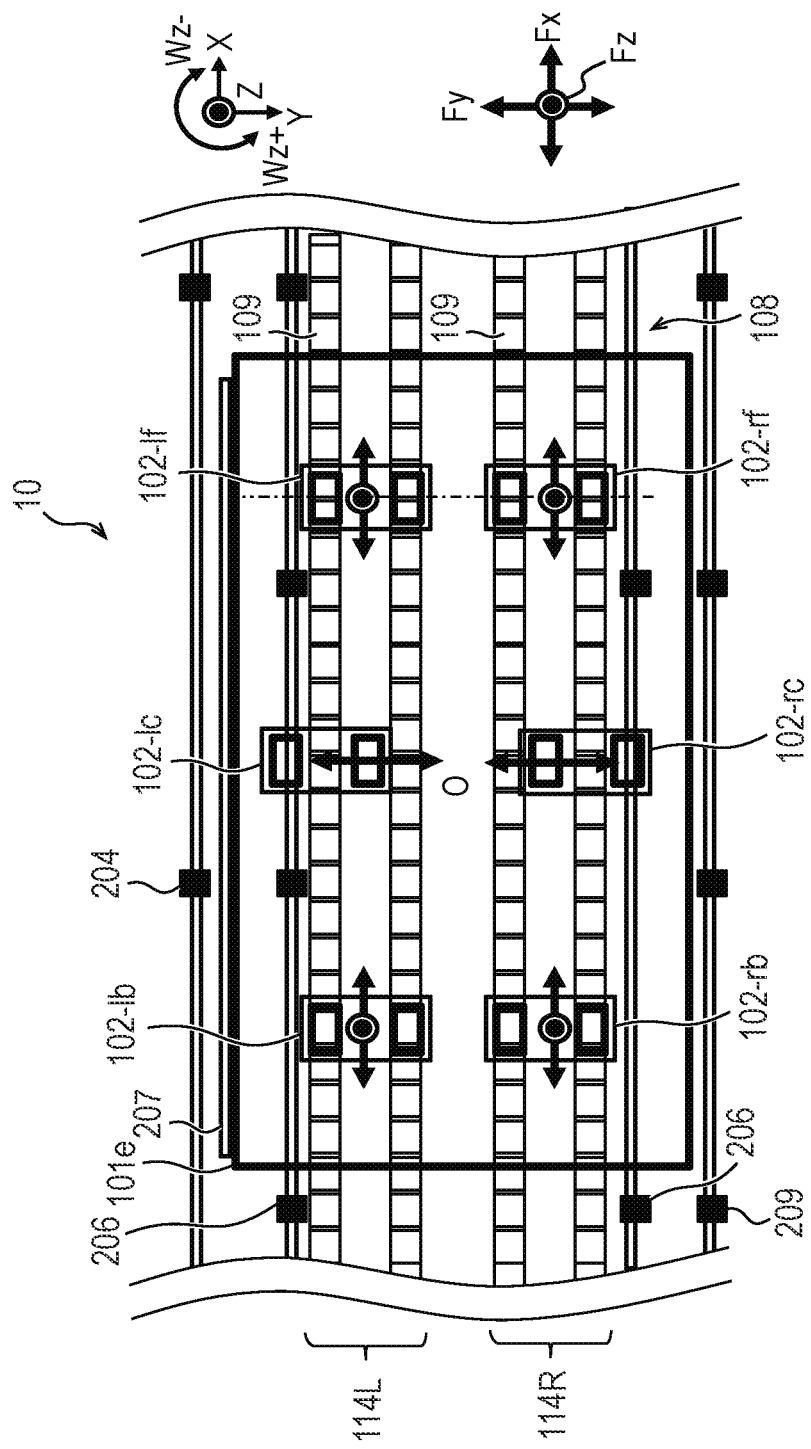

TRANSPORT SYSTEM, MOVER, CONTROL DEVICE, AND CONTROL METHOD

CROSS-REFERENCE TO RELATED APPLICATIONS

This application is a Continuation of International Patent Application No. PCT/JP2020/014370, filed Mar. 27, 2020, which claims the benefit of Japanese Patent Application No. 2019-068354, filed Mar. 29, 2019 and Japanese Patent Application No. 2020-054793, filed Mar. 25, 2020, all of which are hereby incorporated by reference herein in their entirety.

BACKGROUND OF THE INVENTION

Field of the Invention

The present invention relates to a transport system, a mover, a control device, and a control method.

Description of the Related Art

In general, a transport system is used in a production line used for assembling industry products, a semiconductor exposure apparatus, or the like. In particular, a transport system in a production line transports workpieces such as components between a plurality of stations within a factory-automated production line or between factory-automated production lines. Further, such a transport system may be used as a transport apparatus within a processing apparatus. As a transport system, a transport system with permanent magnets for a mover has already been proposed.

In the transport system with permanent magnets for a mover, a guiding apparatus using a linear guide or the like is often used. In the transport system using a guiding apparatus such as a linear guide, however, there is a problem of deteriorated productivity caused by a contaminant generated from a sliding portion of the linear guide, for example, a wear piece or a lubricant oil of a rail or a bearing, a volatilized substance thereof, or the like. Further, there is a problem of shortened life of a linear guide due to increased friction of a sliding portion at high speed transport.

Japanese Patent Application Laid-Open No. 2015-230927 and Japanese Patent Application Laid-Open No. 2016-532308 discloses a non-contact magnetic levitation type moving apparatus or a transport apparatus having no sliding portion as a guide. A permanent magnet movable type linear motor with a total of seven lines is provided in the moving apparatus disclosed in Japanese Patent Application Laid-Open No. 2015-230927, and a permanent magnet movable type linear motor with a total of six lines is provided in Japanese Patent Application Laid-Open No. 2016-532308, in order to control the transport and the attitude of movers.

In the apparatuses disclosed in Japanese Patent Application Laid-Open No. 2015-230927 and Japanese Patent Application Laid-Open No. 2016-532308, a strong permanent magnet is used for the mover. For this reason, in the apparatuses disclosed in Japanese Patent Application Laid-Open No. 2015-230927 and Japanese Patent Application Laid-Open No. 2016-532308, when the mover passes under a high temperature environment, the permanent magnet is demagnetized, so that the ability to control the transport and the attitude of the mover may be lost. Further, in the apparatuses disclosed in Japanese Patent Application Laid-Open No. 2015-230927 and Japanese Patent Application Laid-Open No. 2016-532308, since the permanent magnet of the mover can attract the surrounding magnetic material during the maintenance of the apparatus or when the carrier is moved, measures for ensuring the safety of preventing the injury of the operator or the like are required, and as a result, the workability may deteriorate. For these reasons, it is difficult for the apparatuses disclosed in Japanese Patent Application Laid-Open No. 2015-230927 and Japanese Patent Application Laid-Open No. 2016-532308 to transport the mover in a non-contact manner with excellent workability without impairing the controllability of the mover.

SUMMARY OF THE INVENTION

The present invention intends to provide a transport system, a mover, a control device, and a control method capable of transporting the mover in a non-contact manner without impairing controllability of the mover while securing excellent workability.

According to one aspect of the present invention, provided is a transport system including: a mover including a force receiving part made of soft magnetic material; and a plurality of coils arranged along the first direction, wherein the mover is movable in the first direction along the plurality of coils by a force received by the force-receiving part from a magnetic field by the plurality of coils.

According to another aspect of the present invention, provided is a mover including a force receiving part made of soft magnetic material, wherein the mover is movable, by a force received by the force-receiving part from a magnetic field by a plurality of coils arranged along a first direction, in the first direction along the plurality of coils.

According to further another aspect of the present invention, provided is a control device that controls a mover, the mover comprising a force receiving part made of soft magnetic material, wherein the mover is movable, by a force received by the force receiving part from a magnetic field by a plurality of coils arranged along a first direction, in the first direction along the plurality of coils, wherein the control device comprises a transport control means for controlling a transport of the mover in the first direction by controlling the force.

According to further another aspect of the present invention, provided is a control method that controls a mover, the mover comprising a force receiving part made of soft magnetic material, wherein the mover is movable, by a force received by the force receiving part from a magnetic field by a plurality of coils arranged along a first direction, in the first direction along the plurality of coils, wherein the control method controls a transport of the mover in the first direction by controlling the force.

Further features of the present invention will become apparent from the following description of exemplary embodiments with reference to the attached drawings.

BRIEF DESCRIPTION OF THE DRAWINGS

FIG. 6A is a schematic diagram illustrating a configuration of a transport system according to a second embodiment of the present invention.

DESCRIPTION OF THE EMBODIMENTS

First Embodiment

A first embodiment of the present invention will be described below with reference to FIG. 1A to FIG. 5.

Figure 1A:
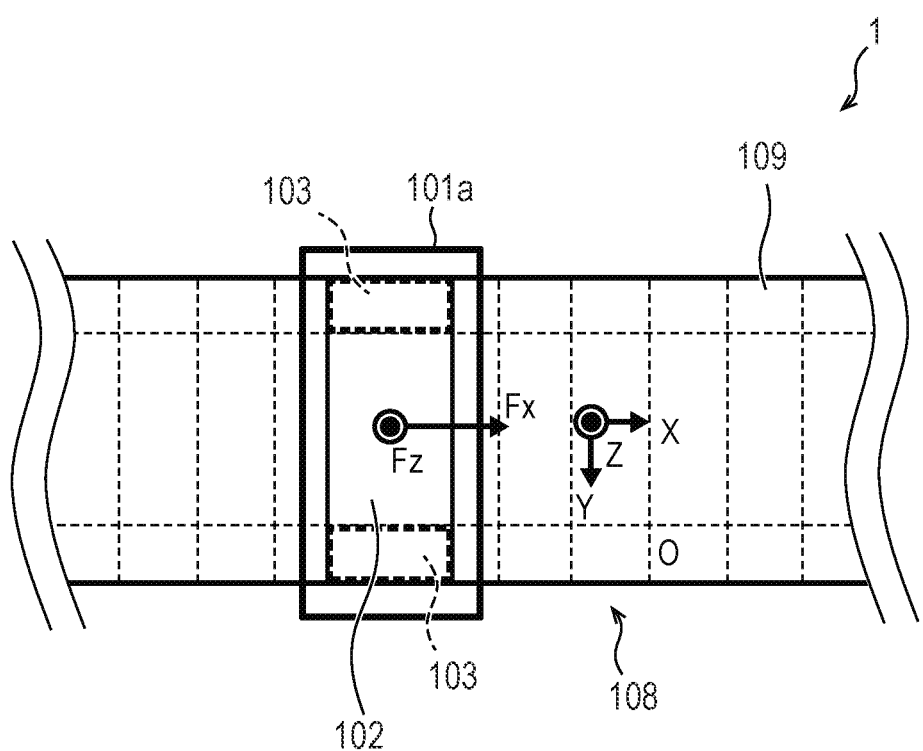
FIG. 1A, FIG. 1B, and FIG. 1C are schematic diagrams illustrating a configuration of a transport system according to a first embodiment of the present invention.
Figure 1B:
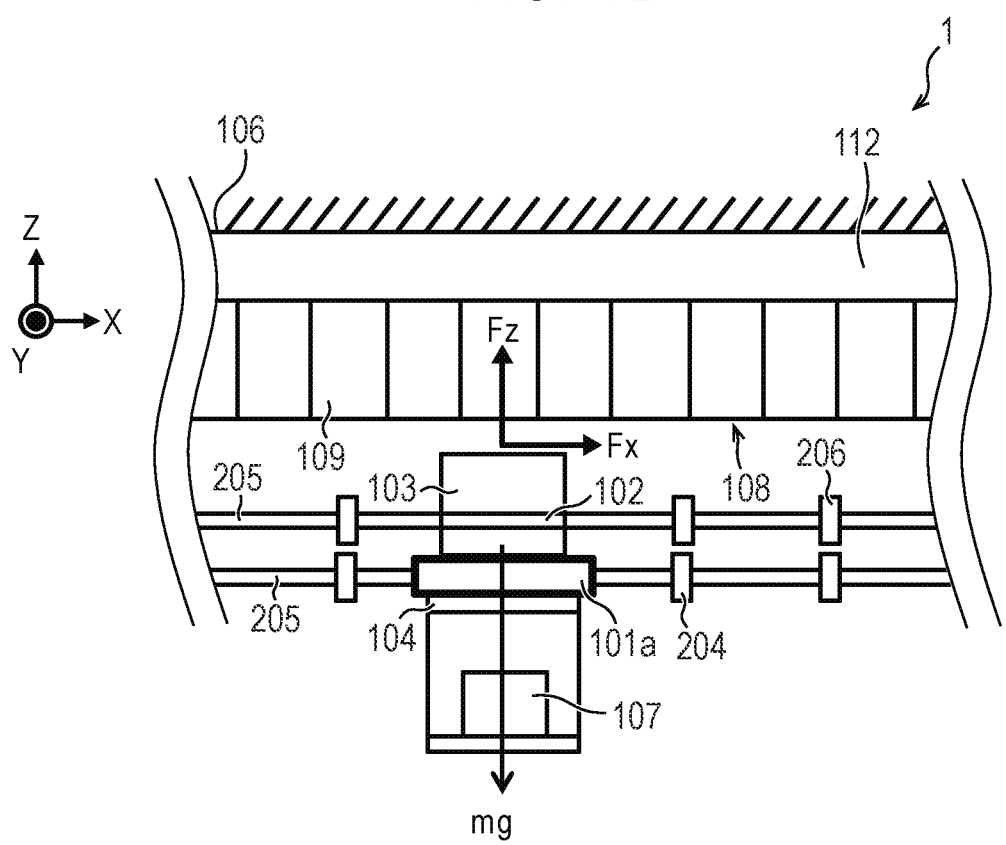
Figure 1C:
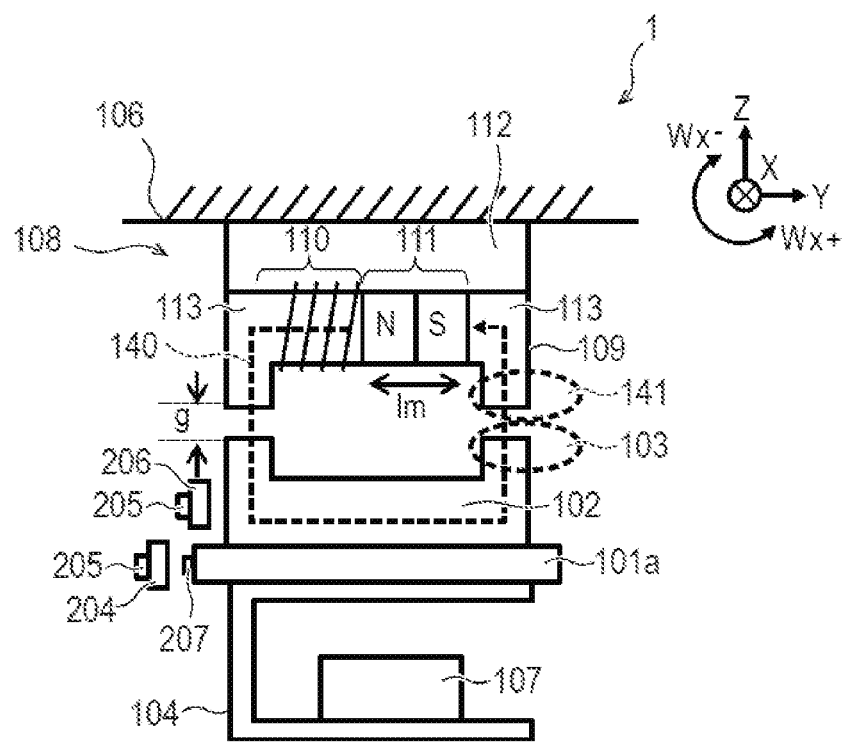

First, a configuration of the transport system according to the present embodiment will be described with reference to FIG. 1A to FIG. 1C. FIG. 1A to FIG. 1C are schematic diagrams illustrating a configuration of the transport system according to the present embodiment. FIG. 1A to FIG. 1C illustrates the main parts of the transport system according to the present embodiment. FIG. 1A is a view of the transport system viewed from the Z direction described later, FIG. 1B is a view of the transport system viewed from the Y direction described later, and FIG. 1C is a view of the transport system viewed from the X direction described later.

As illustrated in FIG. 1A to FIG. 1C, the transport system 1 according to the present embodiment includes a mover 101a constituting a wagon, a slider or a carriage, and a stator 108 constituting a transport path. The stator 108 is disposed above the mover 101a. The transport system 1 is a transport system by a movable yoke type linear motor for transporting a mover 101a including a yoke plate 102. Further, the transport system 1 is configured as a magnetic levitation type transport system for transporting the mover 101a in a non-contact manner with each part of the stator 108 including a plurality of coils 109.

The transport system 1 transports a workpiece 107 placed on the mover 101a to a processing apparatus that performs a processing operation on the workpiece 101 by transporting the mover 101a with the stator 108, for example. In FIG. 1A to FIG. 1C, one mover 101a is shown with respect to the stator 108, but the embodiment is not limited to this. In the transport system 1, a plurality of movers 101a can be transported by the stator 108. In the following description, in addition to the mover 101a, the mover 101 may be referred to by using a numeral sign obtained by changing the alphabet of the numeral sign of the mover 101a such as the mover 101b, 101c, 101d, 101e, etc., but the structure of the mover is the same as that of the mover 101a unless otherwise explained.

Herein, coordinate axes, directions, etc. used in the following description are defined. First, an X-axis is taken along a horizontal direction that is the transport direction of the mover 101a, and the transport direction of the mover 101a is defined as an X-direction. Further, a Z-axis is taken along a perpendicular direction that is a direction orthogonal to the X direction, and the perpendicular direction is defined as a Z direction. Further, a Y-axis is taken along a direction orthogonal to the X direction and the Z direction, and a direction orthogonal to the X direction and the Z direction is defined as the Y direction. Further, a rotation direction around the X-axis is defined as a Wx direction, a rotation direction around the Y-axis is defined as a Wy direction, and a rotation direction around the Z-axis is defined as a Wz direction. Further, in order to distinguish the positive direction and the negative direction in each direction, "+" and "−" are added immediately before "direction" such as "Y+ direction", "Y− direction", and the like. Note that, although the transport direction of the mover 101a is not necessarily required to be a horizontal direction, the Y direction and the Z direction can be similarly defined also in such a case with the transport direction being defined as the X direction. Note that the X direction, the Y direction, and the Z direction are not necessarily limited to directions orthogonal to each other and can be defined as directions crossing each other.

As illustrated in FIG. 1A to FIG. 1C, the mover 101a includes a yoke plate 102, a workpiece placing base 104, and a linear scale 207. The mover 101a functions, for example, as a wagon, slider or carriage for transporting the workpiece 107 to a processing apparatus for performing a machining operation on the workpiece 107. As described below, the mover 101a and can move in the X direction while being levitated in the Z direction with its attitude being controlled, by a force (electromagnetic force) applied to the yoke plate 102 from a magnetic field formed by flowing a current to a plurality of coils 109 of the stator 108. The mover 101a is configured without using a permanent magnet.

The yoke plate 102 is attached to the upper surface of the mover 101a. The yoke plate 102 has a yoke plate salient pole part 103. Specifically, yoke plate salient pole parts 103 are formed at both ends in the Y direction of the yoke plate 102. Each yoke plate salient pole part 103 is a part of a yoke plate 102 protruding upward toward a plurality of coils 109 of a stator 108. That is, the yoke plate salient pole part 103 is a salient pole part protruding toward the plurality of coils 109. The two yoke plate salient pole parts 103 are arranged along the Y direction orthogonal to the X direction that is the transport direction of the mover 101a. The yoke plate salient pole parts 103 may be a plurality of three or more. The plurality of yoke plate salient pole parts 103 can be arranged along a direction such as the Y direction crossing the transport direction.

The yoke plate 102 functions as a force receiving part that receives a force (electromagnetic force) from a magnetic field formed by flowing a current to the coil 109 of the stator 108. The yoke plate 102 has the yoke plate salient pole parts 103 as a part receiving electromagnetic force by the coils 109. At least two or more coils 109 must always face the yoke plate 102. That is, the length of the yoke plate 102 in the transport direction (X direction) is preferably two or more lengths of the coils 109 arranged in the transport direction (X direction).

The yoke plate 102 functioning as the force receiving part is made of a material having a high relative permeability, specifically, a soft magnetic material. The soft magnetic material is a magnetic material that is magnetized when an external magnetic field is applied, but the magnetization disappears when the external magnetic field is removed. Specifically, the yoke plate 102 is made of a laminated silicon steel plate, for example. The material of the yoke plate 102 is not particularly limited, and various soft magnetic materials such as iron, permalloy, sendust, etc. can be used in addition to silicon steel.

The workpiece placing base 104 is attached to a lower surface of the mover 101a, for example. The workpiece 107 is placed on the workpiece placing base 104 to be transported. For example, the workpiece placing base 104 has a shelf part suspended from the lower surface of the mover 101a. In this case, the workpiece 107 is placed on the shelf part of the workpiece placing base 104 to be transported. The mounting position and shape of the workpiece placing base 104 are not particularly limited, and can be appropriately designed according to the size and shape of the workpiece 107.

The linear scale 207 is attached along the X direction to a side surface of the mover 101a along the X direction. The linear scale 207 has a pattern read by an X-direction sensor 204 described later for detecting the position of the mover 101a in the X-direction.

The stator 108 has a plurality of coils 109. The plurality of coils 109 are fixed by a connecting member 112 to a beam 106 spanned along the X-direction that is the transport direction of the mover 101a. The plurality of coils 109 are arranged in a line along the X direction that is the transport direction. The plurality of coils 109 arranged in a line are arranged above the mover 101a. Thus, the stator 108 has one line of a coil array including a plurality of coils 109 arranged in a line above the mover 101a.

The stator 108 has an X-direction sensor 204 and a Z-direction sensor 206. The X-direction sensor 204 can detect the position of the opposed mover 101a in the X-direction. The Z-direction sensor 206 can detect the position of the opposed mover 101a in the Z-direction. The X-direction sensor 204 and the Z-direction sensor 206 are fixed to the beam 106 via a bracket 205 and a member (not shown), respectively.

The X-direction sensor 204 can detect the relative position of the linear scale 207 with respect to the X-direction sensor 204 by reading the pattern of the linear scale 207 attached to the side surface of the mover 101a. Thus, the X-direction sensor 204 can detect the position of the mover 101a in the X-direction.

The Z-direction sensor 206 can detect the position of the mover 101a in the Z-direction by reading a linear scale (not shown) attached to the mover 101a or by detecting a relative distance between the mover 101a and a target (not shown) attached to the mover 101a.

A plurality of the X-direction sensors 204 and the Z-direction sensors 206 are disposed along the X-direction that is the transport direction of the mover 101a. The X-direction sensor 204 and the Z-direction sensor 206 are disposed at intervals such that the mover 101a can be detected at any position on the transport path.

As illustrated in FIG. 1C, the coil 109 includes an iron core 113, a winding part 110, and a permanent magnet 111. The iron core 113 is provided so that the winding part 110 and the permanent magnet 111 are aligned along the Y direction. In the coil 109, the current to be applied, that is, the current flowing through the wire of the winding part 110 is controlled by a control system 3 (see FIG. 5) described later.

By controlling the current, the coil 109 generates an electromagnetic force between the coil 109 and the yoke plate 102 of the mover 101a, and thus can apply a force to the mover 101a. The electromagnetic force acting between the coil 109 and the yoke plate 102 becomes a levitation force for floating the mover 101a in the Z direction and a thrust force for driving the mover 101a in the X direction.

The winding part 110 has an electric wire wound around an iron core 113 with an axis along the Y direction as a center axis. The current flowing through the wire of the winding part 110 is controlled by the control system 3 as described later.

The permanent magnet 111 is incorporated into or substituted for a portion of the iron core 113 so as to be adjacent to the winding part 110 in the Y direction. The permanent magnet 111 is arranged in the magnetic circuit of the coil 109 so that magnetic poles different in polarity from each other are arranged in the Y direction. The permanent magnet 111 included in the coil 109 may be provided in the iron core 113 so as to be included in the magnetic circuit of the coil 109. Since the permanent magnet 111 is included in the coil 109 of the stator 108, when a force is applied to the mover 101a by the coil 109, power consumption due to energization of the coil 109 can be suppressed. However, the permanent magnet 111 need not necessarily be included in the coil 109.

The iron core 113 has coil salient pole parts 141. Specifically, the coil salient pole parts 141 are formed at both ends of the iron core 113 in the Y direction so as to be positioned outside the winding part 110 and the permanent magnet 111, respectively. Each of the coil salient pole parts 141 is a part of the iron core 113 protruding downward so as to be opposed to the yoke plate salient pole part 103 of the mover 101a. That is, the coil salient pole parts 141 are salient parts protruding toward the mover 101a. Each of the coil salient pole parts 141 is constituted so that the XY plane of the coil salient pole parts 141 can face that of the yoke plate salient pole part 103. The XY plane is a plane parallel to the plane formed by the X-axis and the Y-axis.

A magnetic flux 140 due to the magnetomotive force of the permanent magnet 111 and the winding part 110 in the coil 109 mainly passes through the magnetic path as follows. That is, the magnetic flux 140 passes through the iron core 113, passes through a space between the coil salient pole part 141 and the yoke plate salient pole part 103, and passes through the yoke plate 102. Further, the magnetic flux 140 passes through the yoke plate 102, passes through a space between the yoke plate salient pole part 103 and the coil salient pole part 141, and passes through the iron core 113. Thus, the magnetic circuit of magnetic flux 140 is formed in the coil 109 and the yoke plate 102 through the spaces between the coil salient pole parts 141 and the yoke plate salient pole parts 103.

An attractive force acting as a levitation force for levitating the mover 101a in the Z direction acts between the coil 109 and the yoke plate 102. Hereinafter, it will be shown that the magnitude of the change in the attractive force between the coil 109 and the yoke plate 102 has a linear relationship with the current of the winding part 110.

The magnetomotive force Fm [A] of the coil 109 is expressed by the following Expression (1), where Hm [A/m] is the coercive force of the permanent magnet 111, lm [m] is the length of the permanent magnet 111, I [A] is the current flowing through the electric wire of the winding part 110, and N [times] is the number of turns of the winding part 110. In the following expressions, "*" is used as a symbol for multiplication, but "*" is appropriately omitted in the multiplication of a numerical value and a symbol.

$$Fm = Hm*lm + N*I \quad \text{Expression (1)}$$

The magnetoresistance Rm [A/Wb] in the path of the magnetic flux 140 is expressed by the following Expression (2). Note that the gap between the yoke plate salient pole part 103 and the coil salient pole part 141 is denoted by g [m], the length of the permanent magnet is denoted by lm [m], the permeability of vacuum is denoted by µ0, and the cross-sectional area of the magnetic path is denoted by Sm [m²]. Further, it is assumed that the relative permeability of the iron core 113 is sufficiently large and the leakage of the magnetic flux 140 is sufficiently small, and it is noted that the gap g of the space between the coil salient pole part 141 and the yoke plate salient pole part 103 appears twice.

$$Rm = (lm + 2g)/(Sm*\mu 0) \quad \text{Expression (2)}$$

Then, the magnetic flux Φ [Wb] passing through the magnetic path is expressed by the following Expression (3).

$$\blacksquare = \Phi = Fm/Rm \quad \text{Expression (3)}$$
$$= (Hm*lm + N*I)*Sm*\mu 0/(lm + 2g)$$

The magnetic flux density B [Wb/m²] is expressed by the following Expression (4).

$$B = \Phi/Sm \quad \text{Expression (4)}$$
$$= (Hm*lm + N*I)*\mu 0/(lm + 2g)$$

The magnitude Fz of the attractive force acting between the yoke plate salient pole part 103 and the coil salient pole part 141 is expressed by the following Expressions (5) and (6).

$$Fz = (1/2)*Sm*B^2/\mu 0 \quad \text{Expression (5)}$$
$$= (1/2)*Sm*\mu 0*(Hm*lm + N*I)^2/(lm + 2g)^2 \quad \text{Expression (6)}$$

Further, a case where the magnetomotive force produced by the permanent magnet 111 is sufficiently larger than the magnetomotive force produced by the winding part 110, that is, a case where the following Expression (7) is satisfied is considered.

$$N*I << Hm*lm \quad \text{Expression (7)}$$

In this case, if C0 and C1 are defined as constants, Fz expressed by Expression (6) is further expressed by the following Expression (8).

$$Fz = (1/2)*Sm*\mu 0*(Hm*lm + N*I)^2/(lm + 2g)^2 \quad \text{Expression (8)}$$
$$= C0*(Hm*lm)^2*\{1 + N*I/(Hm*lm)\}^2$$
$$\approx C1*\{1 + 2N*I(Hm*lm)\}$$

Therefore, the change ΔFz of the force (Fz) acting on the mover 101a in the Z direction, that is, the difference between Fz in the case of the current I and Fz in the case of the current I being 0, can be expressed by the following Expression (9), where C2 is defined as a constant.

$$\Delta Fz \approx C2*I \quad \text{Expression (9)}$$

Expression (9) shows that ΔFz, the magnitude of the change in the attractive force between the coil 109 and the yoke plate 102, has a linear relationship with the current value I.

Similarly, a case where the magnitude Δg of the fluctuation of the gap g is sufficiently small with respect to lm+2g, that is, a case where the following Expression (10) is satisfied is considered.

$$\Delta g << lm + 2g \quad \text{Expression (10)}$$

In this case, if C3 and C4 are defined as constants, Fz expressed by Expression (6) is further expressed by the following Expression (11).

$$Fz = (1/2)*Sm*\mu 0*(Hm*lm + N*I)^2/\{lm + 2(g + \Delta g)\}^2 \quad \text{Expression (11)}$$
$$= C3/\{lm + 2(g + \Delta g)\}^2$$
$$= C3*(lm + 2g + 2\Delta g)^{-2}$$
$$= C3*\{(lm + 2g)*[1 + 2\Delta g/(lm + 2g)]\}^{-2}$$
$$\approx C4*\{1 - 4\Delta g/(lm + 2g)\}$$

Therefore, it was shown that the magnitude ΔFz of the change in the attractive force Fz has a linear relationship with the change Δg of the gap g as shown in the following Expression (12).

$$\Delta Fz = -4*C4*\Delta g/(lm + 2g) \quad \text{Expression (12)}$$

Therefore, the equation of motion of the mover 101a shown in FIG. 1C is expressed by the following Expression (13) in the vicinity of the equilibrium point where gravity and the attractive force of the permanent magnet are balanced. Note that m [kg] is the mass of the mover 101a, Ks and Ki are defined as constants, and $d^2Z/dt^2$ is the second-order time derivative symbol for the position Z. If the workpiece 107 is mounted on the mover 101a, the mass m of the mover 101a includes the mass of the workpiece 107.

$$m*d^2Z/dt^2 = Ks*\Delta g + Ki*I \quad \text{Expression (13)}$$

In addition, it is generally known in a control theory that the levitation height of the mover 101*a* can be controlled if it is detectable. In the transport system 1 according to the present embodiment, the levitation height of the mover 101*a* can be detected by the Z-direction sensor 206.

Therefore, in the transport system 1 shown in FIG. 1A to FIG. 1C, it is possible to control the position of the mover 101*a* in the Z direction by controlling the magnitude of the current I flowing through the wire of the winding part 110 of the coil 109.

As an example, consider a case where Sm, lm, Hm, and g are the following values, respectively.

$Sm=30\ [mm]*30\ [mm]=0.0009\ [m^2]$ $lm=0.02\ [m]$ $Hm=900\ [kA/m]$ $g=0.01\ [m]$

In this case, since the magnitude of the attractive force Fz can be calculated to be about 110 N, it can be understood that the mover 101*a* having a mass of about 10 kg can be magnetically suspended by the attractive force of the coil 109.

Assuming that the magnitude Δg of the variation of the gap g is about 1 mm, according to Expression (11), the ratio Pf of the magnitude of the variation of the attractive force Fz is calculated to be 2.5% according to the following Expression (14).

$$Pf = \Delta g(lm + 2g) \hspace{2cm} \text{Expression (14)}$$
$$= 1.0\ [mm]/(20\ [mm] + 2*10\ [mm])$$
$$= 0.025 = 2.5[\%]$$

On the other hand, from Expression (8), the ratio Pf of the magnitude of the change in the attractive force due to the current I is expressed by the following Expression (15).

$Pf=2N*I/Hm*lm$ \hspace{2cm} Expression (15)

Assuming that the number of turns N is 100 times, the following Expression (16) holds from Expressions (14) and (15).

$2*100*I/(900\ [kA/m]*0.02\ [m])=0.025$ \hspace{1cm} Expression (16)

From Expression (16), the current I is calculated as 2.25 [A] according to the following Expression (17).

$I=0.025*900*1000*0.02/(2*100)=2.25\ [A]$ \hspace{0.5cm} Expression (17)

It can be understood that the position of the mover 101*a* in the Z direction can be controlled if the current is of such a calculated degree.

Next, a method of controlling the movement of the mover 101*a* in the X-direction that is the transport direction will be described with reference to FIG. 2A and FIG. 2B.

Figure 2A:
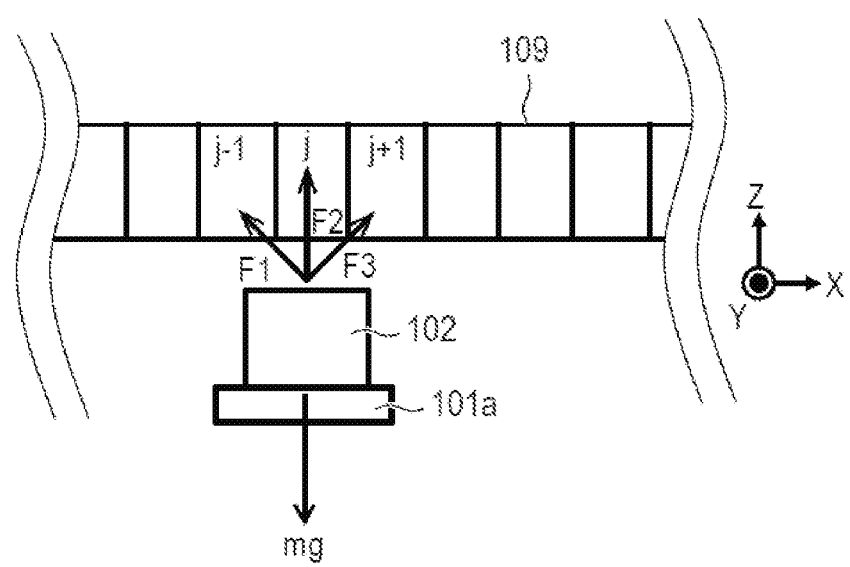
FIG. 2A and FIG. 2B are schematic diagrams for explaining a method of transporting a mover in the transport system according to the first embodiment of the present invention.

FIG. 2A is a view of the mover 101*a* and the coil 109 viewed from the Y direction. In FIG. 2A, the three coils 109 are assigned the numbers j−1, j, and j+1, respectively. In the following descriptions, the coil 109 numbered j−1 is referred to as "coil j−1", the coil 109 numbered j is referred to as "coil j", and the coil 109 numbered j+1 is referred to as "coil j+1". In FIG. 2A, the mover 101*a* is located immediately below the coil number j. Further, forces acting on the yoke plate 102 of the mover 101*a* by the coils j−1, j and j+1 are indicated by F1, F2 and F3, respectively. The gravity acting on the mover 101*a* is shown in mg.

Figure 2B:
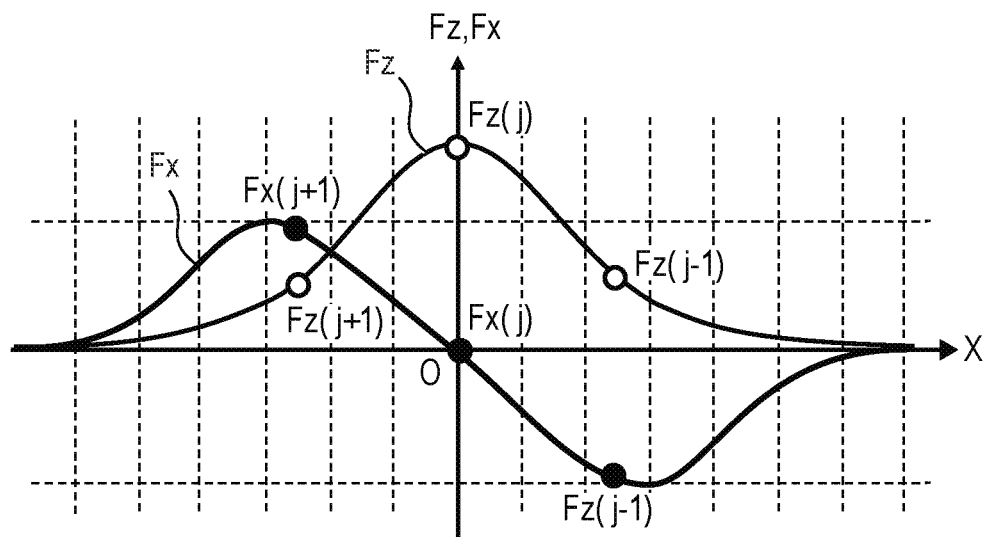

FIG. 2B is a diagram schematically illustrating the position of the mover 101*a* on the horizontal axis and the magnitudes of electromagnetic forces in the X and Z directions generated when current is applied to the coil numbers j−1, j, and j+1 on the vertical axis. In FIG. 2B and FIG. 3B described later, Fx and Fz represent electromagnetic forces in the X and Z directions generated when a unit current is applied, respectively. Fx(i) denotes a force in the X-direction acting between the coil i and the mover 101*a* when a unit current is applied. Further, Fz(i) denotes a force in the Z direction acting between the coil i and the mover 101*a* when a unit current is applied. Note that i is any of j−1, j, and j+1. FIG. 2B shows Fx(i) and Fz(i) in the case where the mover 101*a* is located at the position illustrated in FIG. 2A, respectively, in black and white circles.

In the case illustrated in FIG. 2A, the magnetic flux generated by the permanent magnet 111 of the coil 109 always applies an attractive force between the mover 101*a* and the coil 109. At this time, if the current I flowing through the wire of the winding part 110 acts in the direction of strengthening the magnetic flux formed by the permanent magnet 111, the attractive force becomes large. If the current I acts in a direction to weaken the magnetic flux formed by the permanent magnet 111, the attractive force is weakened and can be regarded as a repulsive force relatively.

Here, it is assumed that, when a positive current is applied to the coil j, the attractive force is increased, and when a negative current is applied, the attractive force is decreased. Then, for example, when the mover 101*a* is located at the position shown in FIG. 2A, if a negative current is applied to the coil j−1 and a positive current is applied to the coil j+1, a positive force acts on the mover 101*a* in the X direction.

Forces generated by currents applied to the coils j−1, j, and j+1 are independent for each coil. Therefore, the X-direction force Fx and the Z-direction force Fz acting on the mover 101*a* are expressed by the following Expressions (18A) and (18B), where I(i) is the current applied to the coil i and Σ is the integral symbol for i. Note that Fx(i), Fz(i), and i are as described above.

$Fx=\Sigma Fx(i)*I(i)$ \hspace{2cm} Expression (18A)

$Fz=\Sigma Fz(i)*I(i)$ \hspace{2cm} Expression (18B)

When the necessary torque is determined in accordance with the attitude of the mover 101*a*, the attitude of the mover 101*a* can be controlled by appropriately selecting the current I(i) to determine Fx and Fz. The current I(i) can be uniquely determined together with Expressions (18A) and (18B) by adding, for example, a condition expressed by the following Expression (19).

$\Sigma I(i)=0$ \hspace{2cm} Expression (19)

When the mover 101*a* is moved in the positive X direction from the position shown in FIG. 2A, the black and white circles in FIG. 2B representing the force exerted by the respective coils 109 move in the positive X direction on the respective profiles representing Fx and Fz.

Figure 3A:
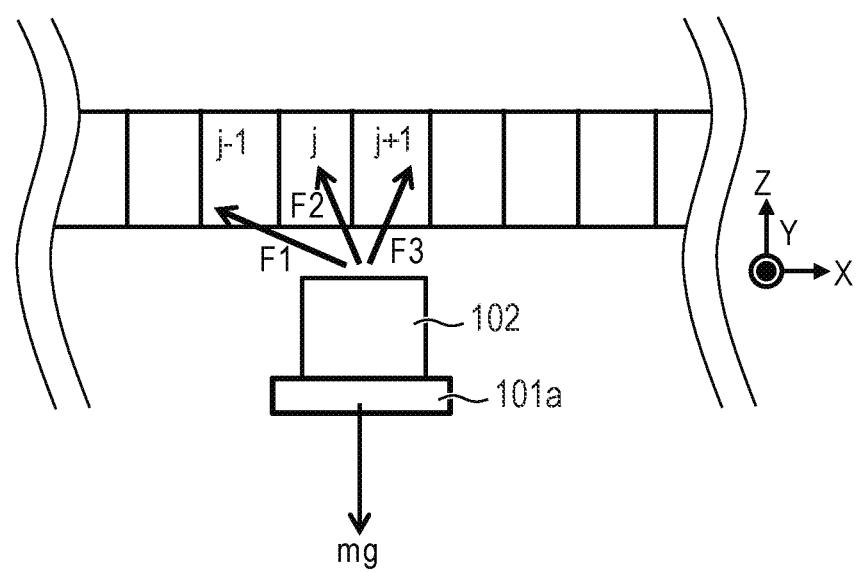
FIG. 3A and FIG. 3B are schematic diagrams for explaining the method of transporting the mover in the transport system according to the first embodiment of the present invention.
Figure 3B:
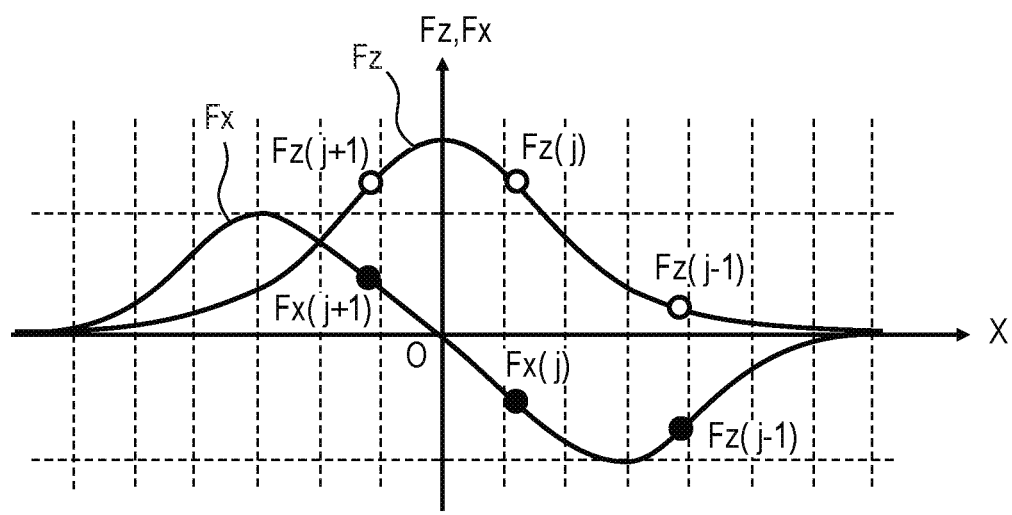

FIG. 3A is a view of the mover 101*a* and the coil 109 when the mover 101*a* is positioned between the coil j and the coil j+1 as viewed from the Y direction. FIG. 3B schematically shows, similar to FIG. 2B, the position of the mover 101*a* on the horizontal axis and the magnitudes of electromagnetic forces in the X and Z directions generated when currents are applied to the coil numbers j−1, j, and j+1 on the vertical axis. FIG. 3B shows Fx(i) and Fz(i) in the case where the mover 101a is located at the position shown in FIG. 3A by black circles and white circles, respectively.

Also, in the cases illustrated in FIG. 3A and FIG. 3B, Fx and Fz can be determined from Expressions (18A), (18B) and (19). Therefore, it is possible to control the attitude of the mover 101a.

In this way, the magnitudes of the forces acting between each coil 109 and the mover 101a can be determined while switching the target coil 109 in accordance with the movement of the mover 101a, and thus the current value I applied to each can be controlled. Thus, the force in the X direction that is the transport direction of the mover 101a can be applied to the mover 101a.

In addition, it is known from a control theory in the same manner as the control in the Z direction that the position of the mover 101a in the X direction can be controlled when the displacement of the mover 101a in the X direction can be detected and the application of the force in the X direction can be controlled linearly with respect to the current value (see Expression (18A)). In the transport system 1 according to the present embodiment, the displacement of the mover 101a in the X direction can be detected by the X-direction sensor 204. Therefore, in the transport system 1, the position of the mover 101a in the X-direction, which is the transport direction, can be controlled.

Figure 4A:
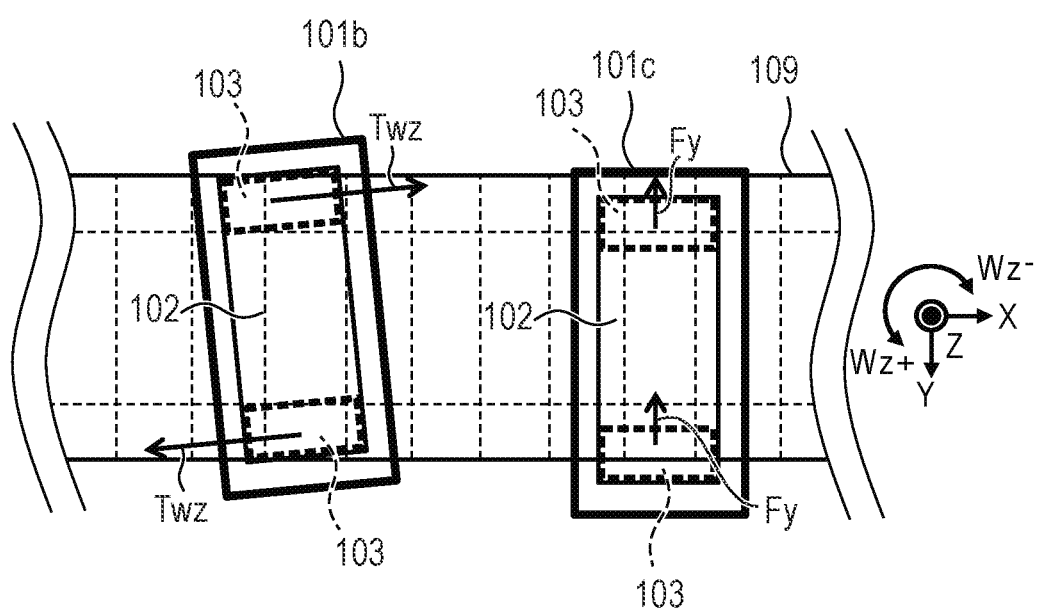
FIG. 4A and FIG. 4B are schematic diagrams for explaining the principle of stabilizing the attitude of the mover in the transport system according to the first embodiment of the present invention.

In the transport system 1 according to the present embodiment, an attractive force is always applied between the yoke plate salient pole part 103 and the coil salient pole part 141 by an electromagnetic force by the coil 109. Therefore, the displacement in the Y direction and the displacement in the Wz direction (the rotational direction around the Z-axis) with respect to the mover 101a is affected by a magnetic restoring force that increases the area where the yoke plate salient pole 103 and the coil salient pole 141 face each other. Thus, in the present embodiment, the mover 101a can be transported while controlling and stabilizing the attitude thereof. This point will be described with reference to FIG. 4A. FIG. 4A illustrates movers 101b and 101c viewed from the Z direction. The movers 101b and 101c have the same structure as the mover 101a.

As illustrated in FIG. 4A, the mover 101b is slightly rotated in the Wz+ direction. In this case, a moment force Twz to be rotated in the Wz- direction acts on the mover 101a due to an attractive force acting between the yoke plate salient pole part 103 and the coil salient pole part 141. As a result, the attitude of the mover 101b is restored.

On the other hand, the mover 101c moves slightly in the Y+ direction. In this case, a force Fy in the Y- direction acts on the mover 101c due to the attractive force acting between the yoke plate salient pole part 103 and the coil salient pole part 141. As a result, the attitude of the mover 101c is restored.

Figure 4B:
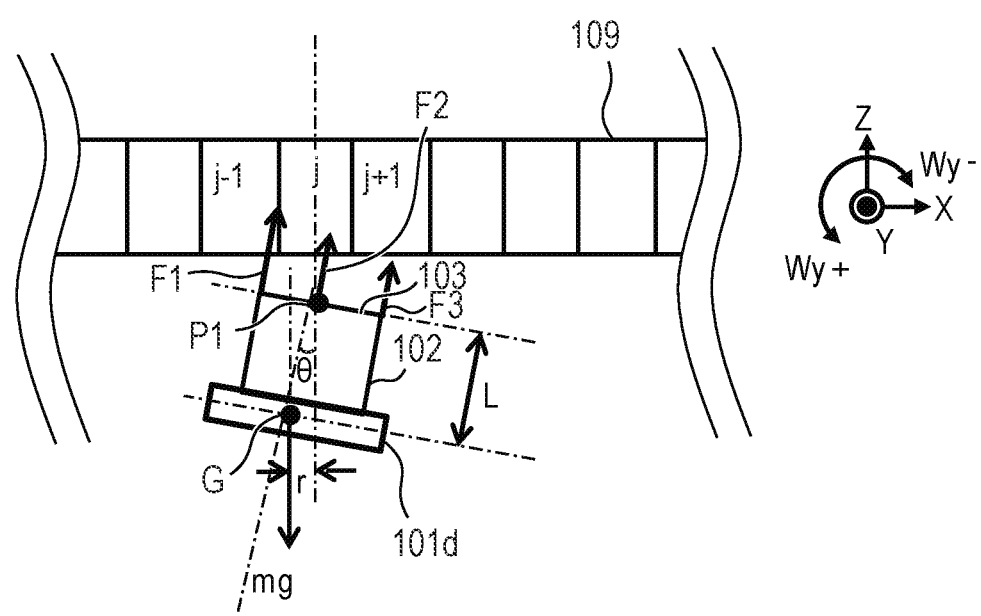

In addition to the above, for displacements in the Wx direction (rotation direction around the X-axis) and in the Wy direction (rotation direction around the Y-axis), a moment force accompanying gravity acting on the mover 101a acts on the mover 101a as a restoring force. This point will be described with reference to FIG. 4B. FIG. 4B illustrates the mover 101d viewed from the Y direction. The mover 101d has the same structure as the mover 101a.

As illustrated in FIG. 4B, the mover 101d rotates slightly in the Wy- direction with the axis P1 along the Y-direction as the rotation axis. In this case, since the yoke plate salient pole part 103 is close to the coil j-1 and far from the coil j+1, a rotational moment in the Wy- direction around the axis P1 is generated in the mover 101c from the balance of attractive forces.

Here, θ is the rotation angle in the Wy- direction, L is the distance from the axis P1 to the center of gravity G of the mover 101d, and mg is the gravity acting on the center of gravity G of the mover 101d. The magnitude of the rotational moment generated by the forces F1, F2 and F3 acting on the yoke plate 102 of the mover 101d by the coils j-1, j, and j+1 due to the rotation of the rotational angle θ is defined as T(θ). At this time, the currents applied to the coils j-1, j, and j+1 are controlled so as to satisfy the following Expression (20).

$$T(\theta) < L*\theta*mg \qquad \text{Expression (20)}$$

Thereby, the gravity mg acting on the center of gravity G of the mover 101d and the rotational moment (L*θ*mg) generated in the Wy+ direction by and the distance L from the axis P1 to the center of gravity G exceed T(θ), and as a result, the attitude of the mover 101d is restored. When the mover 101d is rotated in the Wx direction, the attitude of the mover 101d is similarly restored.

When the vibration component remains in the Wy direction, the Z-direction sensors 206 can be configured so that the distances between the Z-direction sensors 206 are narrowed to make two or more Z-direction sensors 206 able to always detect the mover 101d in order to be able to detect the amount of rotation of the Wy can be detected. In this case, the vibration in the Wy direction can be suppressed or eliminated by controlling the magnitude of the forces F1, F2 and F3 acting on the yoke plate 102 of the mover 101c by the coils j-1, j, and j+1 based on the detected amount of rotation in the Wy direction.

As described above, in the transport system 1 according to the present embodiment, by controlling the current applied to the coil 109, that is, the current flowing to the winding part 110 of the coil 109, the mover 101a not including the permanent magnet can be levitated and transported in a non-contact manner. Since the mover 101a does not include a permanent magnet, when the mover 101a passes under a high temperature environment, the capability of carrying control and attitude control of the mover 101a are not lost due to demagnetization of the permanent magnet. Further, when the transport system 1 is maintained or the mover 101a is moved, the magnetic material around the mover 101a is not attracted to the mover 101a, so that excellent workability can be ensured. Therefore, according to the present embodiment, the mover 101a can be transported in a non-contact manner without impairing the controllability of the mover 101a while securing excellent workability.

Figure 5:
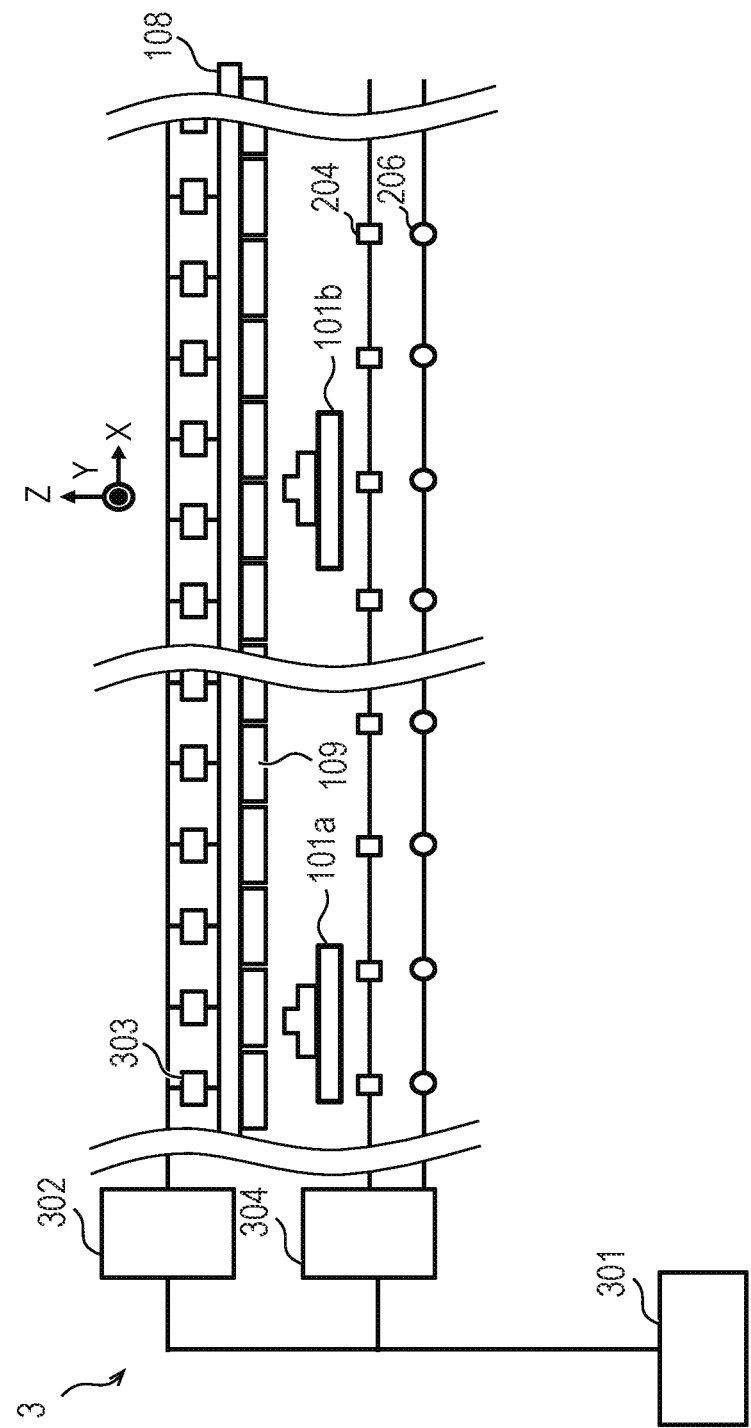
FIG. 5 is a schematic diagram illustrating a control system for controlling the transport system according to the first embodiment of the present invention.

A control system for controlling the transport system 1 by controlling the current applied to the coil 109 will be described below with reference to FIG. 5. FIG. 5 is a schematic diagram illustrating a control system 3 for controlling the transport system 1. Although two movers 101a and 101b are shown in FIG. 5, the number of movers is not limited to this, and may be one or more.

As illustrated in FIG. 5, the control system 3 includes an integration controller 301, a coil controller 302, and a sensor controller 304, and functions as a control device that controls the transport system 1. The coil controller 302 and the sensor controller 304 are communicably connected to the integration controller 301.

A plurality of current controllers 303 are communicably connected to the coil controller 302. The corresponding coil 109 is connected to each current controller 303. The current controller 303 can control the magnitude of the current applied to the connected coil 109.

The coil controller 302 commands a target current value to each of the connected current controllers 303. The current controller 303 controls the amount of current to be applied to the connected coil 109 according to the current value instructed by the coil controller 302.

The plurality of current controllers 303 are mounted in the transport direction corresponding to the plurality of coils 109 arranged in the transport direction of the movers 101*a* and 101*b*.

A plurality of the X-direction sensors 204 and a plurality of the Z-direction sensors 206 are communicably connected to the sensor controller 304.

The plurality of the X-direction sensors 204 are disposed at intervals such that one of them can always measure the position of one of the movers 101*a* and 101*b* during the transport of the movers 101*a* and 101*b*. Further, the plurality of the Z-direction sensors 206 are disposed at intervals such that one of them can always measure the position of one of the movers 101*a* and 101*b* during transport of the movers 101*a* and 101*b*.

The integration controller 301 determines and controls the current command value of the current to be applied to the plurality of coils 109, thereby controlling the non-contact transport of the mover 101*a* while controlling the attitude of the mover 101*a*. That is, the integration controller 301 functions as a transport control means for controlling transport of the mover 101, and controls transport of the mover 101*a* in a non-contact manner by controlling electromagnetic force generated by the plurality of coils 109 and received by the yoke plate 102. The integration controller 301 functions as an attitude control means for controlling the attitude of the mover 101*a*, and controls the attitude of the mover 101*a* by controlling the electromagnetic force generated by the plurality of coils 109 and received by the yoke plate 102. Note that all or part of the function of the integration controller 301 as the control device can be replaced by the coil controller 302 or other control device.

The movers 101*a* and 101*b* in the transport system 1 are transported in the X-direction without contact while being levitated in the Z-direction by controlling the current applied to the coil 109 by the control system 3. Since the movers 101*a* and 101*b* are transported while restoring forces in the Wx, Wy, Wz, and Y directions are applied as described above, the attitudes of the movers 101*a* and 101*b* during transport can be maintained.

Second Embodiment

Figure 6B:
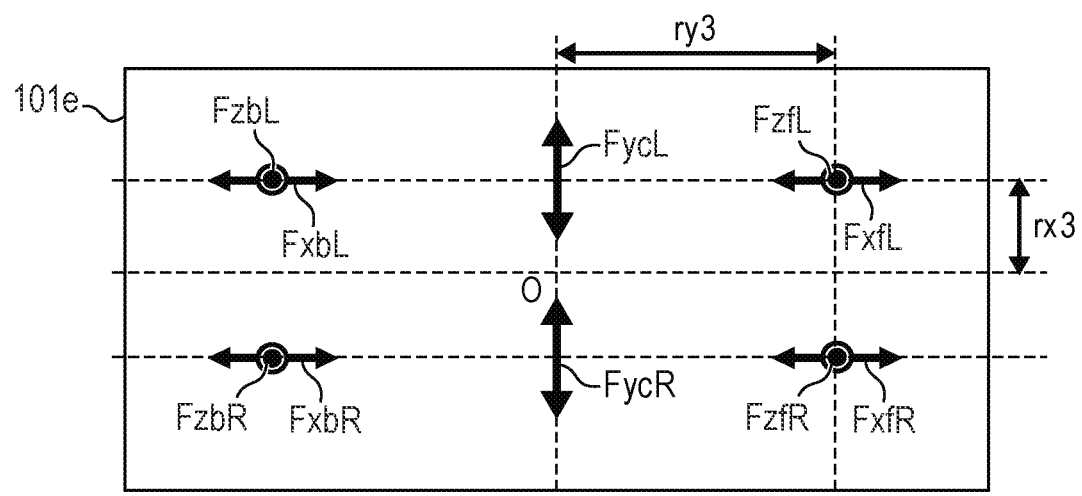
FIG. 6B is a schematic diagram illustrating a force applied to a mover in the transport system according to the second embodiment of the present invention.
Figure 7A:
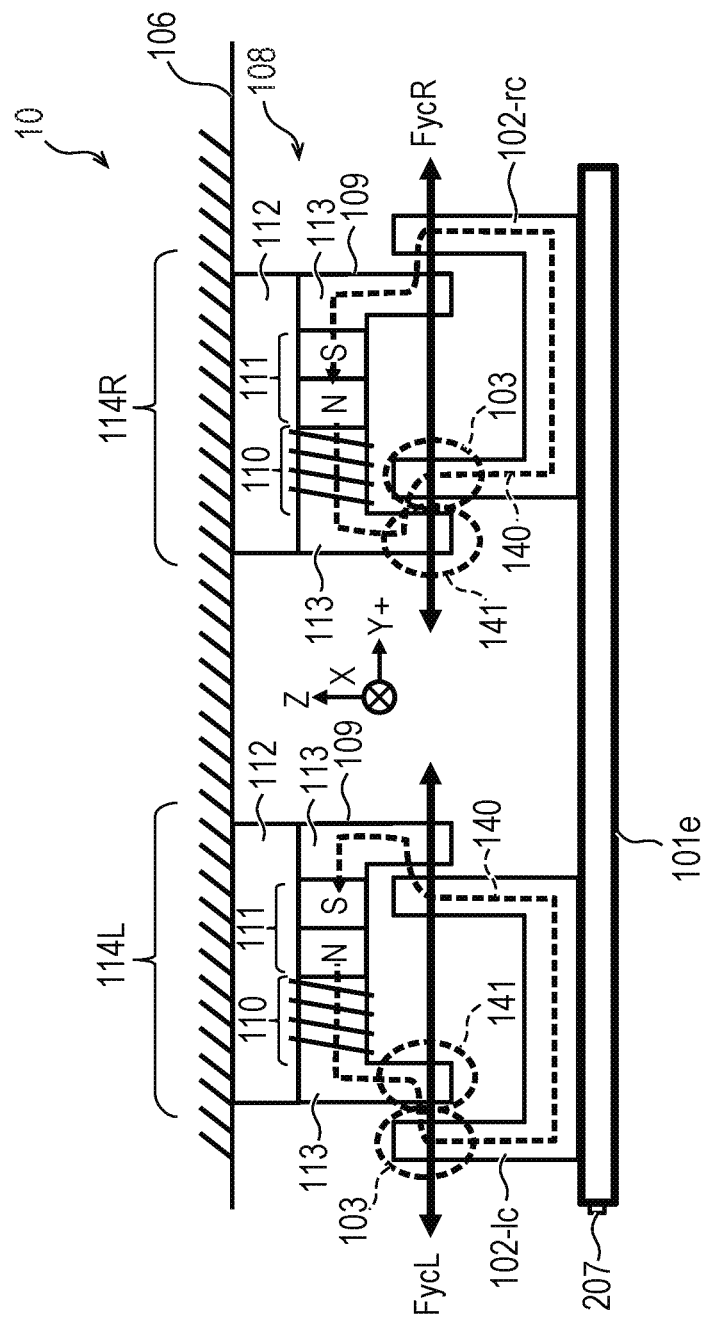
FIG. 7A and FIG. 7B are schematic diagrams illustrating the configuration of the transport system according to the second embodiment of the present invention.
Figure 7B:
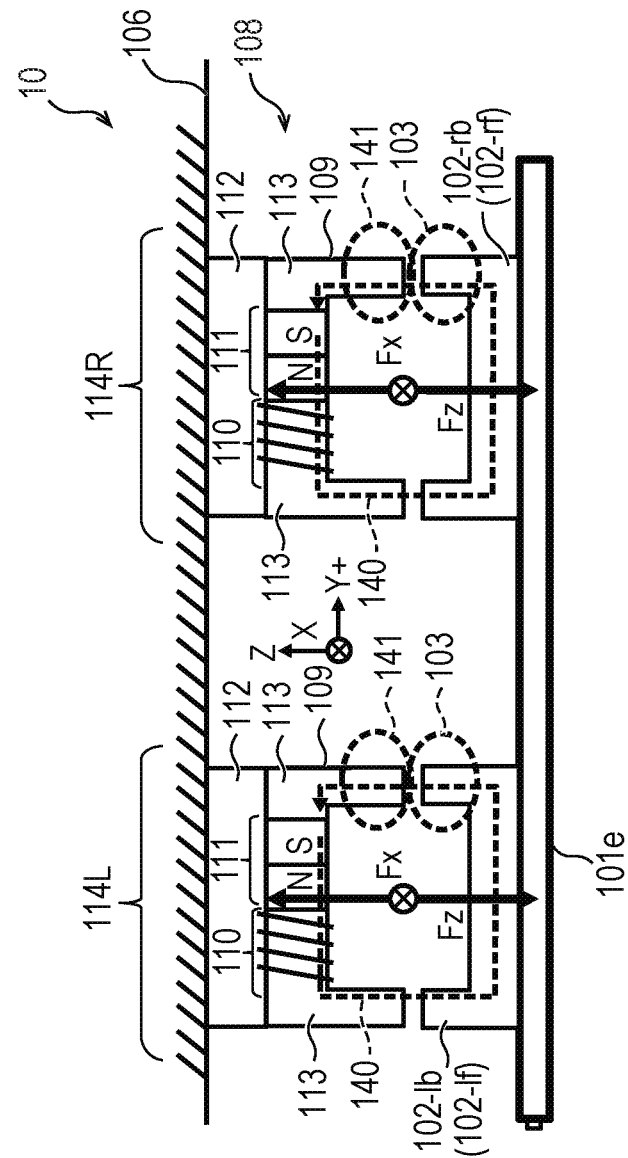
Figure 8:
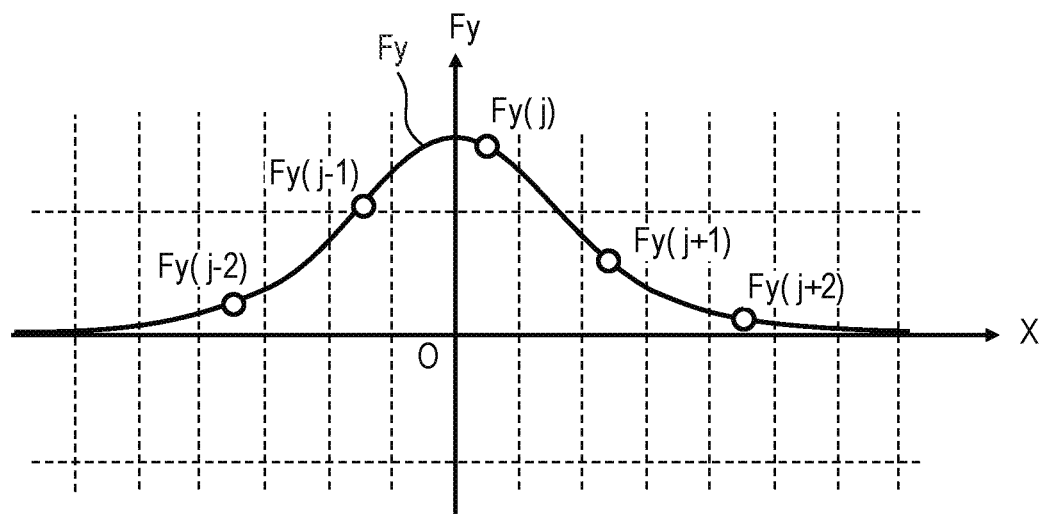
FIG. 8 is a graph schematically illustrating the magnitude of a force acting on a yoke plate of a mover in the transport system according to the second embodiment of the present invention.

A second embodiment of the present invention will be described with reference to FIG. 6A to FIG. 8. FIG. 6A, FIG. 7A, and FIG. 7B are schematic diagrams illustrating a configuration of a transport system according to the present embodiment. FIG. 6B is a schematic diagram illustrating force applied to a mover in the transport system according to the present embodiment. FIG. 8 is a graph schematically illustrating the magnitude of the force acting on the yoke plate of the mover in the transport system according to the present embodiment. Note that the same components as those in the above first embodiment are labeled with the same references, and the description thereof will be omitted or simplified.

FIG. 6A, FIG. 7A, and FIG. 7B extract and illustrate the main parts of the transport system according to the present embodiment. FIG. 6A is a view of the transport system viewed from the Z direction. FIG. 7A and FIG. 7B are views of the transport system viewed from the X direction.

Unlike the first embodiment shown in FIG. 1A to FIG. 1C, in which the coil array including the plurality of the coils 109 is one line, in the transport system 10 according to the present embodiment, as illustrated in FIG. 6A, a plurality of coil arrays, specifically two coil arrays 114L and 114R, are arranged so as to be aligned with each other. The coil arrays 114L and 114R include a plurality of coils 109 arranged in lines in the X direction that is the transport direction. The coils 109 included in the coil arrays 114L and 114R have the same configuration as the coil 109 according to the first embodiment. The control system 3 can control the transport of the mover 101*e* by controlling currents applied to the plurality of coils 109 of the coil arrays 114L and 114R.

The transport system 10 according to the present embodiment is different from the first embodiment in that the mover 101*e* is provided with six yoke plates 102-*lb*, 102-*lc*, 102-*lf*, 102-*rb*, 102-*rc*, and 102-*rf*.

The yoke plates 102-*lb*, 102-*lc*, and 102-*lf* are provided to correspond to the coil array 114L. The yoke plates 102-*lb* and 102-*lf* are arranged side by side along the X direction. The yoke plate 102-*lc* is arranged between the yoke plate 102-*lb* and the yoke plate 102-*lf* so as to be positioned outside the mover 101*e* more than the yoke plates 102-*lb* and 102-*lf*.

The yoke plates 102-*rb*, 102-*rc*, and 102-*rf* are provided to correspond to the coil array 114R. The yoke plates 102-*rb* and 102-*rf* are arranged side by side along the X direction. The yoke plate 102-*rc* is arranged between the yoke plate 102-*rb* and the yoke plate 102-*rf* so as to be positioned outside the mover 101*e* more than the yoke plates 102-*rb* and 102-*rf*.

The yoke plates 102-*lb* and 102-*rb* are arranged side by side along the Y direction. The yoke plates 102-*lc* and 102-*rc* are arranged side by side along the Y direction. The yoke plates 102-*lf* and 102-*rf* are arranged side by side along the Y direction.

As illustrated in FIG. 7B, the yoke plates 102-*lb* and 102-*lf* are configured such that the XY planes of the yoke plate salient pole parts 103 can face those of the coil salient pole parts 141 of the coil 109, respectively, as in the first embodiment. Similarly, as illustrated in FIG. 7B, the yoke plates 102-*rb* and 102-*rf* are configured such that the XY planes of the yoke plate salient pole parts 103 can face those of the coil salient pole parts 141 of the coil 109, respectively, as in the first embodiment.

On the other hand, as illustrated in FIG. 7A, the yoke plate 102-*lc* is configured such that the XZ planes of the yoke plate salient pole parts 103 can face those of the coil salient pole part 141 of the coil 109. Similarly, as illustrated in FIG. 7A, the yoke plate 102-*rc* is configured such that the XZ planes of the yoke plate salient pole parts 103 can face those of the coil salient pole part 141 of the coil 109. The XZ plane is a plane parallel to the plane formed by the X-axis and the Z-axis. In the yoke plates 102-*lc* and 102-*rc*, the XZ plane inside the yoke plate salient pole part 103 can face the XZ plane outside the coil salient pole part 141. In the yoke plates 102-*lc* and 102-*rc*, the XZ plane outside the yoke plate salient pole part 103 can face the XZ plane inside the coil salient pole part 141.

Further, in the transport system 10 according to the present embodiment, a Y-direction sensor 209 is added as shown in FIG. 6A in order to detect the attitude of the mover 101*e*, specifically, the displacement in each direction of the Y direction and the Wz direction. The Y-direction sensors 209 are arranged at intervals at which the two or more Y-direction sensors 209 can always detect the position of the mover 101e in the Y direction regardless of the position of the mover 101e.

The integration controller 301 can calculate the magnitude of the displacement of the mover 101e in the Y direction and the Wz direction by, for example, the least squares method, using the output values of the two or more Y-direction sensors 209 detecting the position of the mover 101e in the Y direction.

The Z-direction sensors 206 are arranged at intervals at which the three or more Z-direction sensors 206 can always detect the position of the mover 101e in the Z direction regardless of the position of the mover 101e.

The integration controller 301 can calculate the height and inclination of the detection plane with respect to the reference plane of the mover 101e by, for example, the least squares method of the plane, using the output values of the three or more Z-direction sensors 206 detecting the position of the mover 101e in the Z-direction. That is, the integration controller 301 can calculate the displacement of the mover 101e in each of the Z direction, the Wx direction and the Wy direction.

The control system 3 can detect the attitude of the mover 101e, specifically, the displacement in each direction of the Y direction, the Z direction, the Wx direction, the Wy direction, and the Wz direction by the Y-direction sensors 209 and the Z direction sensors 206 in the above-described manner. The displacement in each direction may be calculated by the sensor controller 304 instead of the integration controller 301.

Next, a method of applying forces to the mover 101e in the transport system 101 according to the present embodiment will be described with reference to FIG. 6B to FIG. 8. FIG. 6B illustrates a force applied to each of the yoke plates in the mover 101e illustrated in FIG. 6A. FIG. 7A and FIG. 7B also illustrate the force applied to each of the yoke plates in the mover 101e. The forces indicated by the bidirectional arrows in each figure indicate that they can act in either direction.

FIG. 7A is a diagram for explaining the forces applied to the yoke plates 102-*lc* and 102-*rc*. As illustrated in FIG. 7A, the yoke plate 102-*lc* and the coil 109 are configured such that their XZ planes face each other. By constituting the yoke plates 102-*lc* and 102-*rc* in this way, when a current I is applied to the coil 109 in the direction of increasing the magnetic flux 140, the force acts on the yoke plates 102-*lc* in the direction of making the distance between the yoke plate salient pole part 103 and the coil salient pole part 141 smaller. When a current I is applied to the coil 109 in the direction of weakening the magnetic flux 140, the force acts in the direction of making the distance between the yoke plate salient pole part 103 and the coil salient pole part 141 larger.

For example, in FIG. 7A, a current in the positive direction (a direction for increasing the magnetic flux 140) is applied to the coil 109 facing the yoke plate 102-*lc*, and a current in the negative direction (a direction for decreasing the magnetic flux 140) is applied to the coil 109 facing the yoke plate 102-*rc*. In this case, a force in the Y+ direction can be generated as a force acting on the mover 101e.

FIG. 8 is a graph schematically illustrating the magnitude of the force acting on the yoke plate 102-*lc* in the Y direction when a unit current is applied to the coil 109 in the vicinity of the yoke plate 102-*lc* as in FIG. 2B and FIG. 3B. The force acting on the yoke plate 102-*rc* in the Y direction can be considered in the same manner. In FIG. 8, the force F(i) in the Y direction acting between the coil i and the yoke plate 102-*lc* is indicated by a white circle. Note that i is any of j−2, j−1, j, j+1 and j+2.

At this time, with I(i) as the magnitude of the current applied to the coil i, and Σ as an integral symbol for i, the force Fy acting on the yoke plate 102-*lc* is expressed by the following Expression (21).

$$Fy = \Sigma Fy(i) * I(i) \qquad \text{Expression (21)}$$

Here, the yoke plate 102-*lc* and the coil i are designed so as to satisfy the following Expression (22) with C as a constant.

$$I(i) = C * Fy(i) \qquad \text{Expression (22)}$$

Then, the following Expression (23) is established from Expressions (21) and (22).

$$Fy = \Sigma Fy(i) * C * Fy(i) \qquad \text{Expression (23)}$$

The constant C can be calculated from the Expression (23), and the current applied to the coil i can be uniquely determined.

By constituting the yoke plates 102-*lc* and 102-*rc* in this manner, it is possible to control the force acting on the mover 101e in the Y direction by using the current applied to the coil 109. The yoke plates 102-*lc* and 102-*rc* function as force receiving parts for receiving electromagnetic force by the plurality of coils 109 in the Y direction that is the direction crossing the X direction that is the transport direction and the Z direction that is the levitation direction of the mover 101e.

FIG. 7B illustrates the forces applied to the yoke plates 102-*lb*, 102-*lf*, 102-*rb*, and 102-*rf*. The forces can be applied to the yoke plates 102-*lb*, 102-*lf*, 102-*rb*, and 102-*rf* in the X and Z directions according to the same principle as in the first embodiment. The yoke plates 102-*lb*, 102-*lf*, 102-*rb*, and 102-*rf* function as force receiving parts for receiving electromagnetic forces by the plurality of coils 109 in the X direction that is the transport direction and in the Z direction crossing the X direction.

FIG. 6B schematically illustrates the forces that can be generated by the six yoke plates 102-*lb*, 102-*lc*, 102-*lf*, 102-*rb*, 102-*rc*, and 102-*rf* illustrated in FIG. 6A. As illustrated in FIG. 6B, the yoke plates 102-*lb* and 102-*lf* are arranged at positions separated from the center O of the mover 101e by a distance rx3 in the Y direction on the same side in the Y direction. The yoke plates 102-*lb* and 102-*lf* are arranged at positions separated from each other at the opposite sides in the X direction by a distance ry3 from the center O of the mover 101e in the X direction. Similarly, the yoke plates 102-*rb* and 102-*rf* are arranged at positions separated from the center O of the mover 101e by a distance rx3 in the Y direction on the same side in the Y direction. The yoke plates 102-*rb* and 102-*rf* are arranged at positions separated from each other at the opposite sides in the X direction by a distance ry3 from the center O of the mover 101e in the X direction.

In the yoke plate 102-*lb*, a force FzbL in the Z direction and a force FxbL in the X direction can be generated. In the yoke plate 102-*lf*, a force FzfL in the Z direction and a force FxfL in the X direction can be generated. In the yoke plate 102-*lc*, a force FycL in the Y direction can be generated.

Similarly, in the yoke plate 102-*rb*, a force FzbR in the Z direction and a force FxbR in the X direction can be generated. In the yoke plate 102-*rf*, a force FzfR in the Z direction and a force FxfR in the X direction can be generated. In the yoke plate 102-*rc*, a force FycR in the Y direction can be generated.

In the transport system 10, in order to transport the mover 101*e*, necessary forces and torques may be generated and applied by an appropriate controller from information on the attitude and the position of the mover 101*e* acquired from the sensor group. For example, a PID controller can be used as the controller.

Here, the force applied to the mover 101*e* is defined as the torque vector T and the force vector F by the following Expressions (24) and (25), respectively.

$$T=(Tx, Ty, Tz, Twx, Twy, Twz) \quad \text{Expression (24)}$$

$$F=(FzfL, FzbL, FzbR, FzfR, FxfL, FxbL, FxbR, FxfR, FycL, FycR) \quad \text{Expression (25)}$$

Then, the following Expressions (26) to (31) are established.

$$Tx=FxbL+FxfL+FxbR+FxfR \quad \text{Expression (26)}$$

$$Ty=FycL+FycR \quad \text{Expression (27)}$$

$$Tz=FzbL+FzfL+FzbR+FzfR \quad \text{Expression (28)}$$

$$Twx=\{(FzbL+FzfL)-(FzbR+FzfR)\}*rx3 \quad \text{Expression (29)}$$

$$Twy=\{(FzbL+FzbR)-(FzfL+FzfR)\}*ry3 \quad \text{Expression (30)}$$

$$Twz=\{(FxbR+FxfR)-(FxbL+FxfL)\}*rx3 \quad \text{Expression (31)}$$

Although there are innumerable force vectors F satisfying these six Expressions (26) to (31), the force vector F can be uniquely determined by introducing the conditions represented by the following Expressions (32) to (35).

$$FxbL=FxfL \quad \text{Expression (32)}$$

$$FxbR=FxfR \quad \text{Expression (33)}$$

$$FycL=FycR \quad \text{Expression (34)}$$

$$FzfL-FzbL=FzfR-FzbR \quad \text{Expression (35)}$$

As described above, in the present embodiment, the magnitudes of the force components or the moment components of the six axes in the X direction, the Y direction, the Z direction, the Wx direction, the Wy direction, and the Wz direction acting on the mover 101*e* can be detected. The six-axis force components or torque components acting on the mover 101*e* can be linearly controlled with respect to the current of the coil 109 by the control system 3. Therefore, according to the present embodiment, by controlling the currents applied to the plurality of coils 109 of the coil arrays 114L and 114R by the control system 3, the mover 101*e* can be transported in the X direction while controlling the attitude of the mover 101*e* in six axes.

Third Embodiment

Figure 9A:
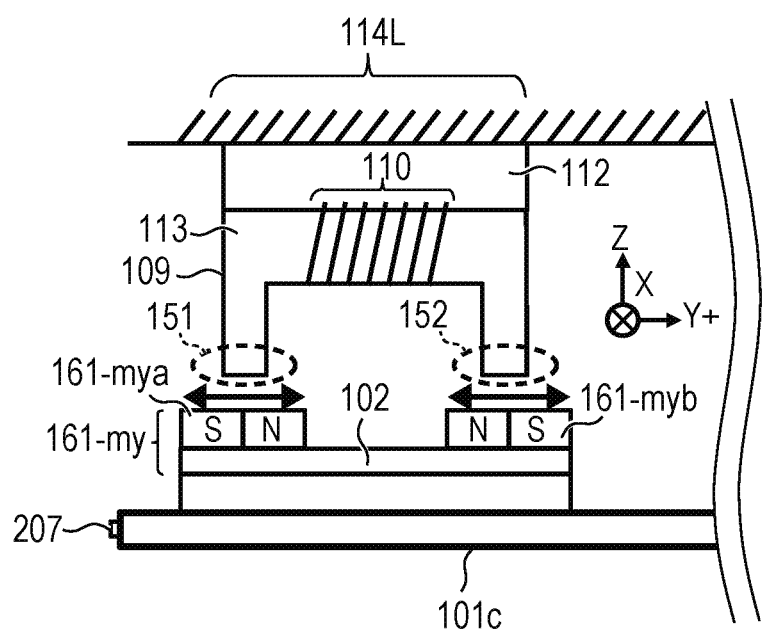
FIG. 9A, FIG. 9B, and FIG. 9C are schematic diagrams illustrating a configuration of a transport system according to a third embodiment of the present invention.
Figure 9B:
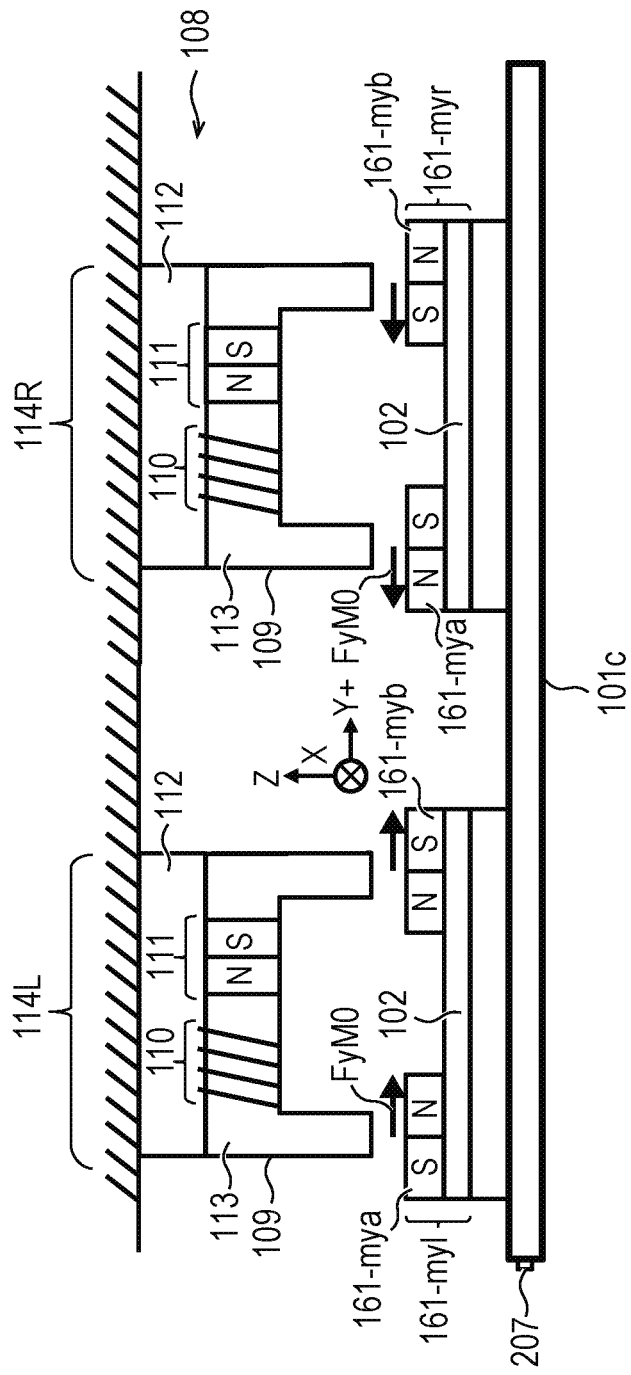
Figure 9C:
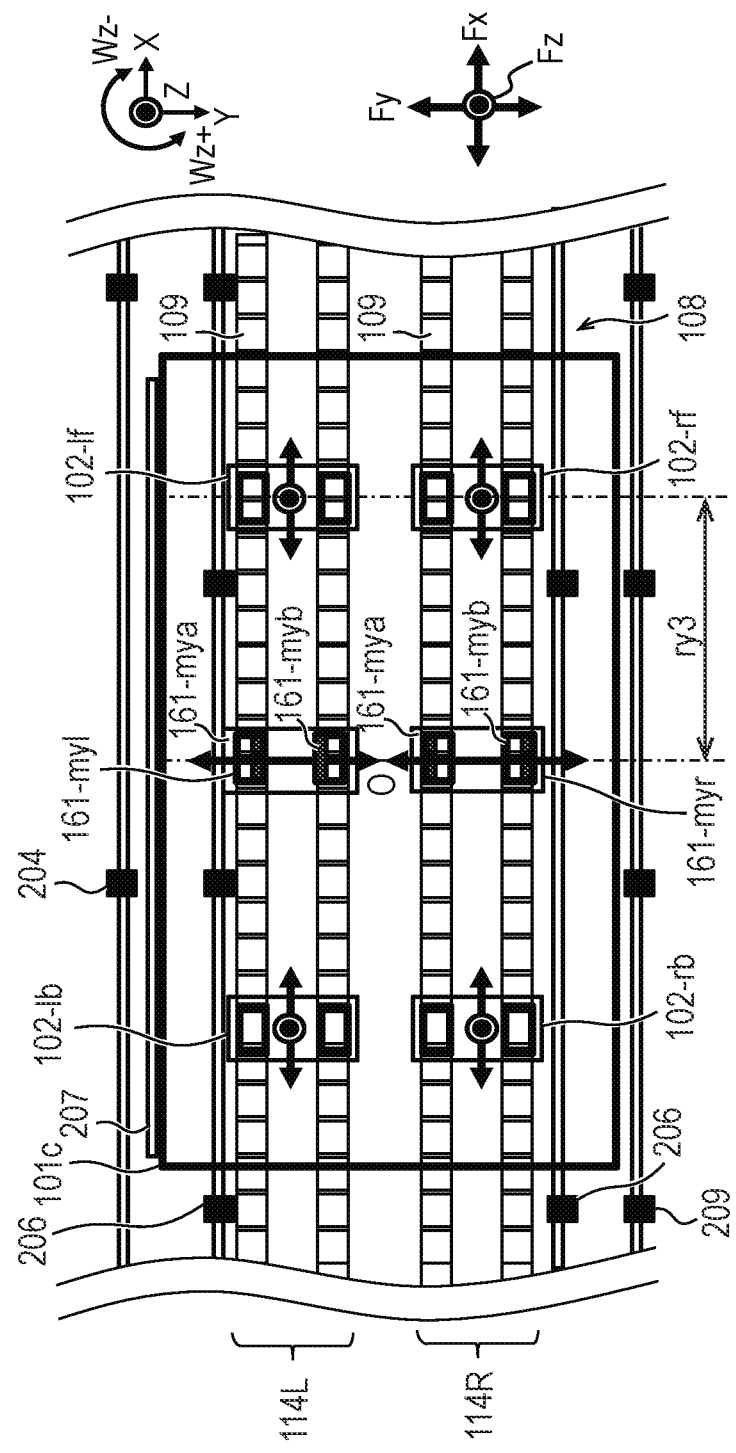

A third embodiment of the present invention will be described with reference to FIG. 9A, FIG. 9B, and FIG. 9C. FIG. 9A, FIG. 9B, and FIG. 9C are schematic diagrams illustrating a configuration of the transport system according to the present embodiment. Note that the same components as those in the above first and second embodiments are labeled with the same references, and the description thereof will be omitted or simplified.

FIG. 9A illustrates forces in the Y direction applied to the mover in this embodiment. As illustrated in FIG. 9A, in the present embodiment, in the mover 101*c*, the permanent magnet group 161-*my* is installed in place of the yoke plates 102-*lc* and 102-*rc* for generating the force in the Y direction in the second embodiment. The permanent magnet group 161-*my* has a set of 2 permanent magnets 161-*mya* and 161-*myb* and a yoke plate 102.

In the permanent magnet group 161-*my*, two permanent magnets 161-*mya* and 161-*myb* are provided on the yoke plate 102 so as to face coil salient pole parts 151 and 152 of the coil 109, respectively. The coil salient poles 151 and 152 are formed in the same manner as the coil salient pole 141 in the iron core 113. FIG. 9A illustrates the coil 109 of a type that does not include a permanent magnet therein.

The permanent magnets 161-*mya* and 161-*myb* are arranged so that magnetic poles different in polarity from each other are arranged in the Y direction. The magnetic poles of the permanent magnets 161-*mya* and 161-*myb* facing each other have the same polarity. In FIG. 9A, the N pole of the permanent magnet 161-*mya* and the N pole of the permanent magnet 161-*myb* face each other. Thus, the permanent magnets 161-*mya* and 161-*myb* are arranged along the Y direction in the mover 101*c*.

In the configuration illustrated in FIG. 9A, a case is considered in which the coil salient pole 151 is excited to the N-pole and the coil salient pole 152 is excited to the S-pole with respect to the coil 109. In this case, the permanent magnet 161-*mya* receives a force on the Y+ side with respect to the coil salient pole part 151. Similarly, the permanent magnet 161-*myb* receives a force on the Y+ side with respect to the coil salient pole part 152. Therefore, the permanent magnet group 161-*my* receives a force on the Y+ side.

If a current is applied to the coil 109 so as to excite it in the opposite direction from the above case, the permanent magnet group 161-*my* receives a force on the Y− side. Therefore, by controlling the direction of excitation by controlling the amount of current applied to the coil 109, it is possible to control the force in the Y direction to the permanent magnet group 161-*my*.

The coil 109 is not limited to the type shown in FIG. 9A in which the permanent magnet is not included. The coil 109 may be of a type that includes a permanent magnet therein, as illustrated in FIG. 9B. In this case, even when no current is applied to the coil 109, a force FyM0 of a certain magnitude is applied to the permanent magnet group 161-*my* in the Y direction.

For the coil 109 of this type, as illustrated in FIG. 9B and FIG. 9C, another pair of the coil 109 and the permanent magnet group 161-*my* are provided in the Y direction, and one permanent magnet group 161-*myl* and the other permanent magnet group 161-*myr* are set out of the two sets of permanent magnets group 161-*my*. FIG. 9B is a view viewed from the X direction, and FIG. 9C is a view viewed from the Z direction. In the permanent magnet group 161-*myl* and the permanent magnet group 161-*myr*, the arrangements of magnetic poles in the permanent magnets 161-*mya* and 161-*myb* are reversed. Thus, in the permanent magnet group 161-*myl* and the permanent magnet group 161-*myr*, the direction of the applied force FyM0 is opposite to each other. Thus, when no current is applied to each of the coils 109, the forces in the Y direction can be canceled from each other. Thus, even in the case shown in FIG. 9B, by applying currents to the coils 109, a force can be generated in the Y direction as in the case shown in FIG. 9A.

As in the present embodiment, the force in the Y direction can be controlled by using the permanent magnet group 161-*my* or the permanent magnet groups 161-*myl* and 161-*myr* instead of the yoke plates 102-*lc* and 102-*rc* which generate the force in the Y direction in the second embodiment. Such permanent magnet groups 161-*my* or permanent magnet groups 161-*myl* and 161-*myr* can be incorporated into the second embodiment. In this case, as in the second embodiment, the mover 101c can be transported while controlling the attitude of the mover by six axes.

Fourth Embodiment

Figure 10:
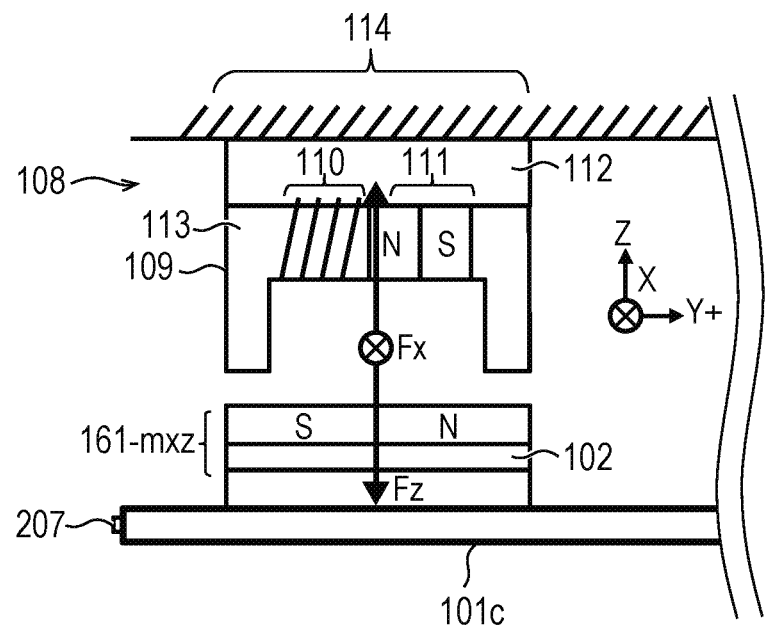
FIG. 10 is a schematic diagram illustrating a configuration of a transport system according to a fourth embodiment of the present invention.

A fourth embodiment of the present invention will be described with reference to FIG. 10. FIG. 10 is a schematic diagram illustrating a configuration of the transport system according to the present embodiment. Note that the same components as those in the above first to third embodiments are labeled with the same references, and the description thereof will be omitted or simplified.

As illustrated in FIG. 10, in the present embodiment, a permanent magnet 161-*mxz* is provided in the mover 101c in place of the yoke plates 102-*lb*, 102-*lf*, 102-*rb*, and 102-*rf* in the second embodiment. The permanent magnet 161-*mxz* is arranged along the Y direction, and are arranged on the yoke plate 102 so that magnetic poles different in polarity from each other are arranged in the Y direction. By using a permanent magnet 161-*mxz* instead of the yoke plates 102-*lb*, 102-*lf*, 102-*rb*, and 102-*rf*, the attractive force can be increased when no current is applied to the coil 109.

In this embodiment as well, since the method of applying the force in the X direction and the Z direction is the same as in the second embodiment, the mover 101c can be transported while controlling the attitude of the mover 101c by six axes as in the second embodiment.

Fifth Embodiment

Figure 11:
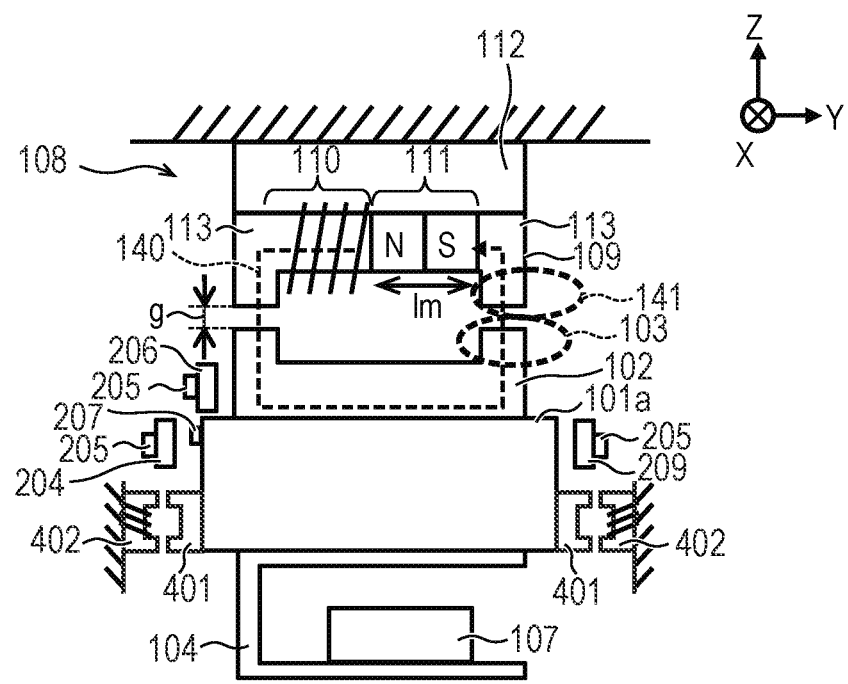
FIG. 11 is a schematic diagram illustrating a configuration of a transport system according to a fifth embodiment of the present invention.

A fifth embodiment of the present invention will be described with reference to FIG. 11. FIG. 11 is a schematic diagram illustrating a configuration of a transport system according to the present embodiment. Note that the same components as those in the above first to fourth embodiments are labeled with the same references, and the description thereof will be omitted or simplified.

As illustrated in FIG. 11, in the present embodiment, coils 402 and yokes 401 for Y-direction control are provided, and Y-direction sensors 209 for Y-direction detection are provided in the configuration of the first embodiment.

The yokes 401 are disposed on both side surfaces of the mover 101a along the X direction. A plurality of the coils 402 are provided in the stator 108. In the stator 108, the plurality of coils 402 are arranged in a line along the X direction on both sides of the mover 101a so as to be able to face the yokes 401 on both sides of the mover 101a.

The Y-direction sensor 209 can detect the position of the mover 101a in the Y-direction by detecting the relative distance between the mover 101a and a target (not shown) attached to the mover 101a.

The coil 402 may also be configured such that, for example, the coil controller 302 commands a target current value to the current controller 303, and the current controller 303 controls the magnitude of the current applied to the coil 402. Since the attractive force acts between the coil 402 and the yoke 401 by applying a current to the coil, the magnitude of the force in the Y direction to the mover 101a can be controlled by controlling the magnitude of the current of the coils 402 on both the left and right sides.

In the present embodiment, since the yokes 401 and the coils 402 are further included, the force in the Y direction can be positively controlled as compared with the first embodiment 1. Therefore, in present embodiment, it is possible to transport the mover 101a while further stabilizing the attitude of the mover 101a.

Modified Embodiments

The present invention is not limited to the embodiments described above, and various modifications are possible.

For example, in the above embodiments, the cases where only the electromagnetic force generated by the coil 109 and received by the mover 101a is used as the levitation force for levitating the mover 101a have been described, but the embodiment is not limited thereto. For example, when the mass of the mover 101a or the mass of the workpiece 107 placed on the mover 101a is large and the levitation force to be applied in the vertical direction is large, the levitation force may be assisted by separately using the static pressure by a fluid such as air for the levitation.

Further, in the above embodiments, the cases where the plurality of coils 109 are arranged in one line or two lines have been described as examples, but the embodiment is not limited thereto. The plurality of coils 109 can be arranged in a plurality of lines according to the number of the yoke plates 102 arranged on the mover 101a.

Further, the transport system according to the present invention can be used as a transport system that transports a workpiece together with a mover to an operation area of each processing apparatus such as a machine tool that performs each operation process on the workpiece that is an article in a manufacturing system that manufactures an article such as an electronic device. The processing apparatus that performs the operation process may be any apparatus such as an apparatus that performs assembly of a component to a workpiece, an apparatus that performs painting, or the like. Further, the article to be manufactured is not limited to a particular article and may be any component.

As described above, the transport system according to the present invention can be used to transport a workpiece to an operation area, perform an operation process on the workpiece transported in the operation area, and manufacture an article. According to the embodiments described above, it is possible to transport a mover stably in a contactless state while controlling the attitude of the mover.

Therefore, the article manufacturing system employing the transport system according to the present invention for transporting the workpiece can stably transport the workpiece while securing excellent workability.

According to the present invention, it is possible to transport the mover in a non-contact manner without impairing controllability of the mover while securing excellent workability.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The invention is not limited to the above embodiments, and various modifications and variations are possible without departing from the spirit and scope of the invention. Accordingly, the following claims are attached to make the scope of the present invention public.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A transport system comprising:
a mover including a force receiving part made of soft magnetic material; and
a stator having a plurality of coils arranged along a first direction,
wherein each coil of the plurality of coils includes a permanent magnet,
wherein the mover is movable in the first direction along the plurality of coils while being levitated by a force received by the force receiving part from a magnetic field formed by the plurality of coils,
wherein the mover includes permanent magnets arranged along a second direction that intersects the first direction, and
wherein the permanent magnets of the mover are arranged (i) in a first group having two permanent magnets in which north poles of the two permanent magnets of the first group face one another and (ii) in a second group having two permanent magnets in which south poles of the two permanent magnets of the second group face each other.

2. The transport system according to claim 1, wherein the force receiving part includes a salient pole part protruding toward a side of the plurality of coils.

3. The transport system according to claim 2, wherein the force receiving part includes plural salient pole parts arranged along a second direction that intersects the first direction in a horizontal direction.

4. The transport system according to claim 1, wherein the mover is movable in the first direction while an attitude of the mover in the second direction is controlled by the force received by the force receiving part.

5. The transport system according to claim 1, wherein each of the plurality of coils of the stator includes an iron core and the iron core includes a coil salient pole part protruding toward a side of the mover.

6. The transport system according to claim 1, wherein each of the plurality of coils of the stator and the force receiving part of the mover form a magnetic circuit of magnetic flux such that each permanent magnet of the stator is arranged in the magnetic circuit.

7. The transport system according to claim 1,
wherein the mover includes, as the force receiving part, a first force receiving part and a second force receiving part,
wherein the first force receiving part receives a force in the first direction and receives a force in the second direction, by the plurality of coils, and
wherein the second force receiving part receives a force in a third direction that intersects the first and second directions, by the plurality of coils.

8. The transport system according to claim 1, wherein the plurality of coils is arranged above the mover.

9. A processing system comprising:
the transport system according to claim 1; and
a processing apparatus configured to process a workpiece transported by the mover.

10. A method of manufacturing an article using a processing system having the transport system according to claim 1, and a processing apparatus configured to process a workpiece transported by the mover, the method comprising:
transporting the workpiece by the mover; and
processing, by the processing apparatus, the workpiece transported by the mover.

11. The transport system according to claim 1, wherein the first direction is a transport direction of the mover and the mover is configured to move in the transport direction without using a permanent magnet included with the mover to move in the transport direction.

12. The transport system according to claim 1, wherein the transport system is such that at least two or more coils of the plurality of coils always face the force receiving part, each coil of the plurality of coils further includes a winding part, and the magnetic field is formed as magnetic fields by the plurality of winding parts and the plurality of permanent magnets of the stator.

13. The transport system according to claim 1,
wherein the force receiving part is a yoke plate attached to an upper surface of the mover, the mover further includes a workpiece placing base attached to a lower surface of the mover and a linear scale attached to a side surface of the mover along the first direction where linear scale includes a pattern configured to be read by a sensor to detect a position of the mover in the first direction, and
wherein a length of the yoke plate in the first direction is at least a length of two coils of the plurality of coils in the first direction.

14. The transport system according to claim 1,
wherein the soft magnetic material is a magnetic material configured to be magnetized when an external magnetic field is applied and where the magnetization disappears when the external magnetic field is removed, and
wherein the force receiving part is a yoke plate attached to an upper surface of the mover and is made of a laminated silicon steel plate.

15. The transport system according to claim 1, wherein the force receiving part is a first yoke and the plurality of coils is a plurality of first coils, the transport system further comprising:
second yokes disposed on both sides of the mover along the first direction; and
a plurality of second coils provided as part of the stator and arranged in a line along the first direction on both sides of the mover so as to be able to face the second yokes on both sides of the mover, whereby, since the second yokes and the plurality of second coils are included, force in a second direction that intersects the first direction can be positively controlled to transport the mover while further stabilizing an attitude of the mover.

* * * * *